United States Patent
Ogura et al.

(10) Patent No.: US 8,173,514 B2
(45) Date of Patent: May 8, 2012

(54) METHOD OF MANUFACTURING SEMICONDUCTOR DEVICE

(75) Inventors: Jusuke Ogura, Kawasaki (JP); Hikaru Kokura, Kawasaki (JP); Hideyuki Kojima, Kawasaki (JP); Toru Anezaki, Kawasaki (JP); Hiroyuki Ogawa, Kawasaki (JP); Junichi Ariyoshi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 282 days.

(21) Appl. No.: 12/369,859

(22) Filed: Feb. 12, 2009

(65) Prior Publication Data

US 2009/0215243 A1    Aug. 27, 2009

(30) Foreign Application Priority Data

Feb. 22, 2008 (JP) ................................ 2008-041782

(51) Int. Cl.
*H01L 21/76* (2006.01)
(52) U.S. Cl. ........................................ 438/424; 438/400
(58) Field of Classification Search .................. 438/400, 438/424
See application file for complete search history.

(56) References Cited

U.S. PATENT DOCUMENTS

| 6,433,297 | B1 * | 8/2002 | Kojima et al. | ........... | 219/121.43 |
| 2004/0147099 | A1 * | 7/2004 | Hashimoto et al. | ........... | 438/584 |
| 2007/0095787 | A1 * | 5/2007 | Mezzapelle | ........... | 216/58 |

FOREIGN PATENT DOCUMENTS

JP    2-244628 A    9/1990

OTHER PUBLICATIONS

M. Hayashi et al., "Desorption Species from Fluorocarbon film by Ar+ Ion Beam Bombardment," J. Vac. Sci. Technol A., vol. 18, No. 4, Jul./Aug. 2000, pp. 1881-1886.
Korean Office Action dated Jan. 5, 2011, issued in corresponding Korean Patent Application No. 10-2009-0013430.

* cited by examiner

*Primary Examiner* — Bradley K Smith
(74) *Attorney, Agent, or Firm* — Westerman, Hattori, Daniels & Adrian, LLP

(57) ABSTRACT

A method of manufacturing a semiconductor device includes forming an isolation region defining an active region in a semiconductor substrate, forming a first insulating film over the semiconductor substrate, forming a second insulating film having etching properties different from those of the first insulating film over the first insulating film, selectively removing the second insulating film from a first region over the active region and the isolation region by dry etching using a fluorocarbon-based etching gas, removing a residual film formed by the dry etching over the first insulating film by exposure in an atmosphere containing oxygen, and selectively removing the first insulating film from the first region by wet etching.

13 Claims, 40 Drawing Sheets

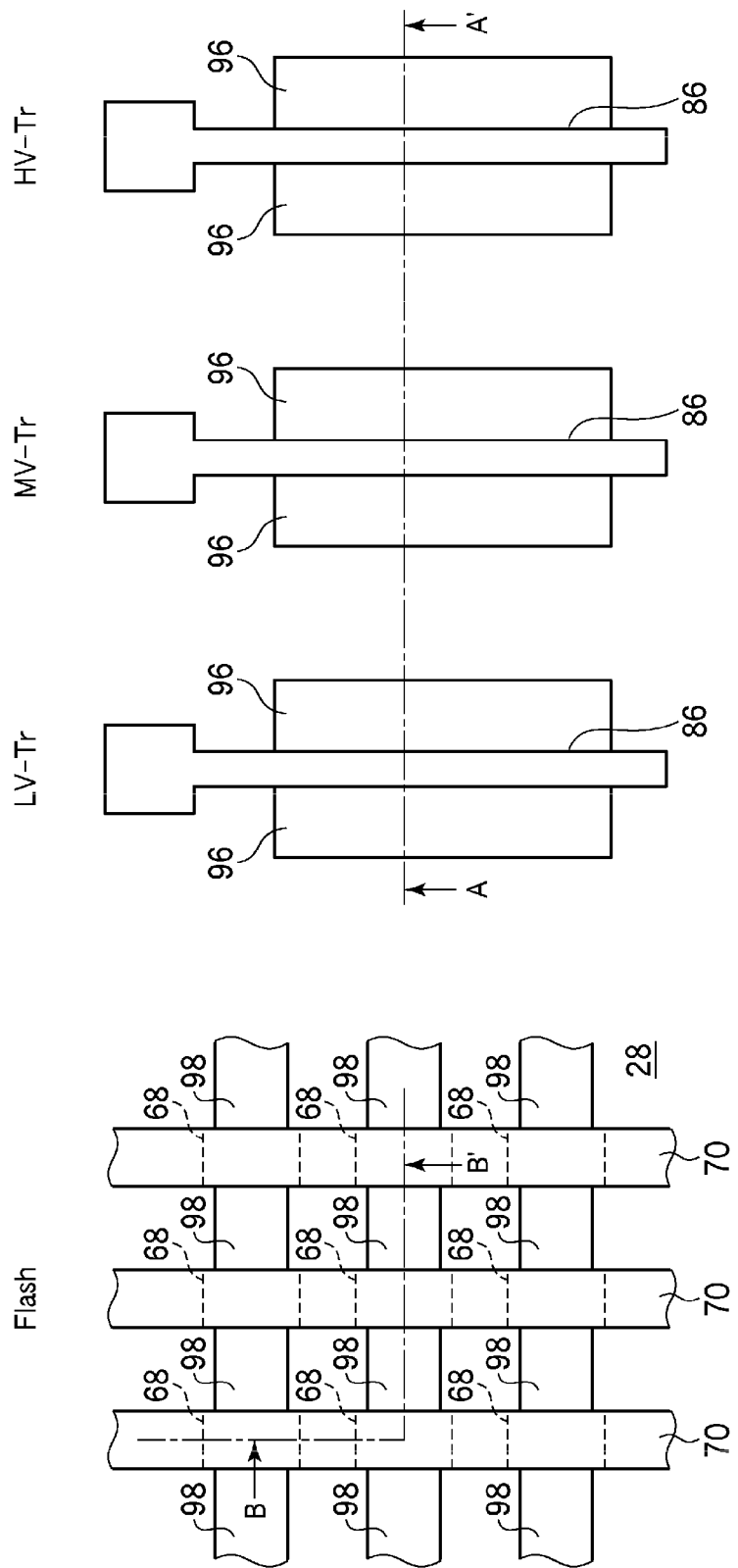

METHOD OF MANUFACTURING SEMICONDUCTOR DEVICE

CROSS-REFERENCE TO RELATED APPLICATION

This application is based upon and claims the benefit of priority of the prior Japanese Patent Application No. 2008-041782 filed on Feb. 22, 2008, the entire contents of which are incorporated herein by reference.

FIELD

An aspect of the embodiments discussed herein is directed to a method of manufacturing a semiconductor device including a transistor and a non-volatile memory.

BACKGROUND

A semiconductor device including a transistor and a non-volatile memory has established product lines, such as a complex programmable logic device (CPLD) and a field programmable gate array (FPGA), and has developed a large market because of its programmable features.

In a semiconductor device including a transistor and a non-volatile memory, for example, besides flash memory cells, high-voltage transistors for flash memory control and low-voltage transistors for high performance logic circuit are integrated on one semiconductor chip. In this case, unlike a single layer gate electrode structure of the high-voltage transistor or the low-voltage transistor, the flash memory cell has a stack gate electrode structure including a floating gate and a control gate laminated to each other.

In general, in the gate electrode of the flash memory cell having a stack gate structure, the floating gate is formed from a first layer conductive film, and the control gate is formed from a second layer conductive film. The gate electrode of a peripheral transistor having a single layer gate structure is formed from the second layer conductive film. In addition, between the floating gate and the control gate, an inter-gate insulating film is formed to insulate between the above two gates for capacitive coupling. This inter-gate insulating film is formed of a multilayer film (such as an ONO film) typically including a silicon oxide film and a silicon nitride film and is not formed in a peripheral transistor forming region. Hence, in a process of manufacturing a semiconductor device including a transistor and a non-volatile memory, before the second layer conductive film is deposited, removing the inter-gate insulating film provided in the peripheral transistor forming region may be performed.

In addition, as the non-volatile memory, besides the above flash memory, a non-volatile memory having a single layer gate structure in which an insulating film (such as an ONO film) is used as a charge storage layer has also been known. In the case of this non-volatile memory, before a gate electrode is formed, the charge storage layer provided in a peripheral transistor forming region may be removed. A high-voltage transistor used for controlling a non-volatile memory has been formed by a manufacturing process similar to that for the flash memory described above.

The prior arts regarding to the manufacturing method how to remove the a multilayer film from the semiconductor substrate are known in the patent documents as follows: Japanese Laid-open Patent Publication No. 02-244628 and M. Hayashi et al., "Deposition species from fluorocarbon film by $Ar^+$ ion beam bombardment", *J. Vac. Sci. Technol.* A, Vol. 18, No. 4, July/August 2000, pp. 1881 to 1886.

SUMMARY

According to an aspect of an embodiment, a method of manufacturing a semiconductor device includes forming an isolation region defining an active region in a semiconductor substrate, forming a first insulating film over the semiconductor substrate, forming a second insulating film having etching properties different from those of the first insulating film over the first insulating film, selectively removing the second insulating film from a first region over the active region and the isolation region by dry etching using a fluorocarbon-based etching gas, removing a residual film formed by the dry etching over the first insulating film by exposure in an atmosphere containing oxygen; and selectively removing the first insulating film from the first region by wet etching.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a plan view illustrating the structure of a semiconductor device according to a first embodiment;

DESCRIPTION OF EMBODIMENTS

As described previously, when the process of manufacturing a semiconductor device including a transistor and a non-volatile memory was investigated by the inventors of the embodiments, it was found that in a semiconductor device manufactured by the process described above, the withstand voltage of a gate insulating film of a peripheral transistor may be degraded.

Preferred embodiments of the present embodiments will be explained with reference to accompanying drawings.

A method of manufacturing a semiconductor device according to a first embodiment will be described with reference to FIGS. 1 to 31.

Figure 2A:
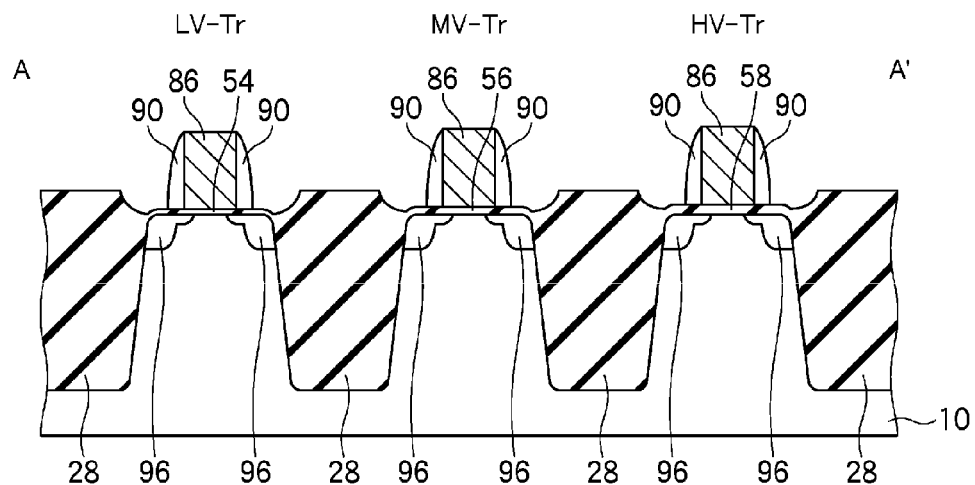
FIGS. 2A-2B are schematic cross-sectional views each illustrating the structure of the semiconductor device according to the first embodiment.
Figure 2B:
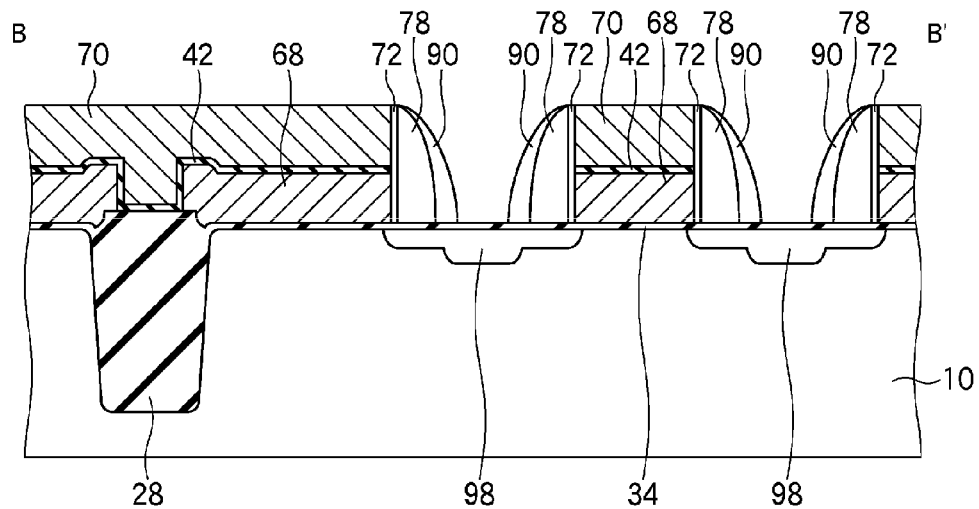
Figure 29A:
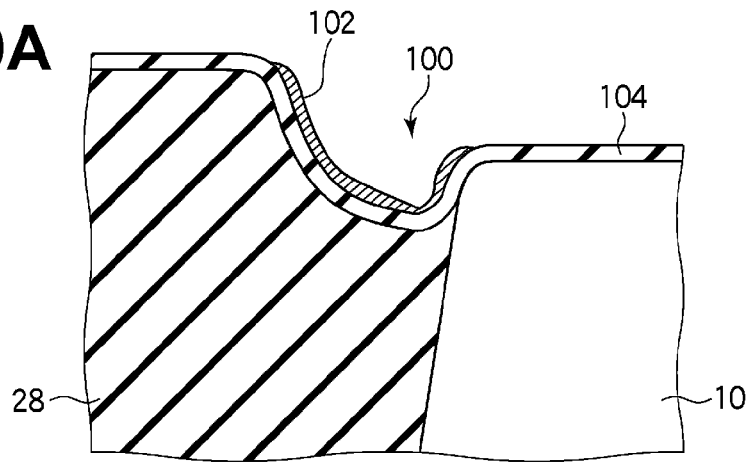
FIGS. 29A-29C are cross-sectional views each illustrating influence of a fluorocarbon film during a process of removing an ONO film.
Figure 29B:
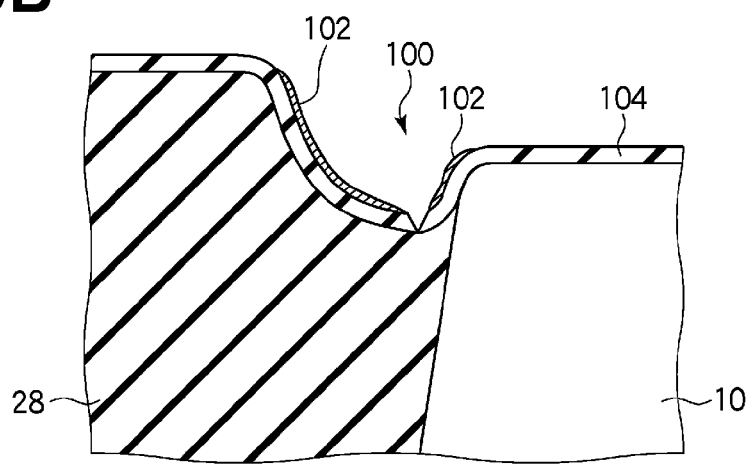
Figure 29C:
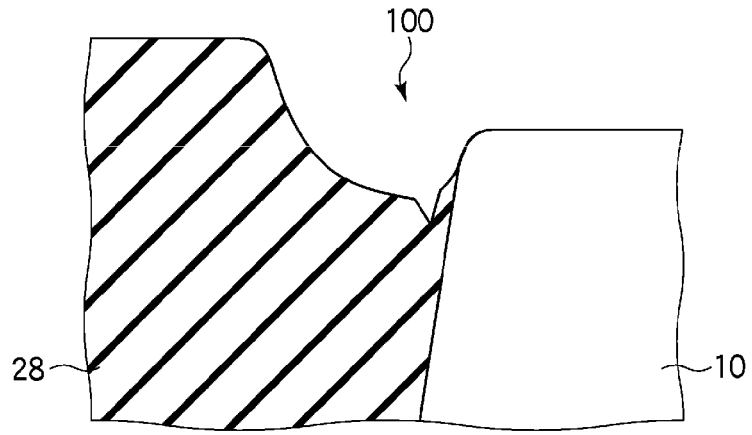
Figure 30A:
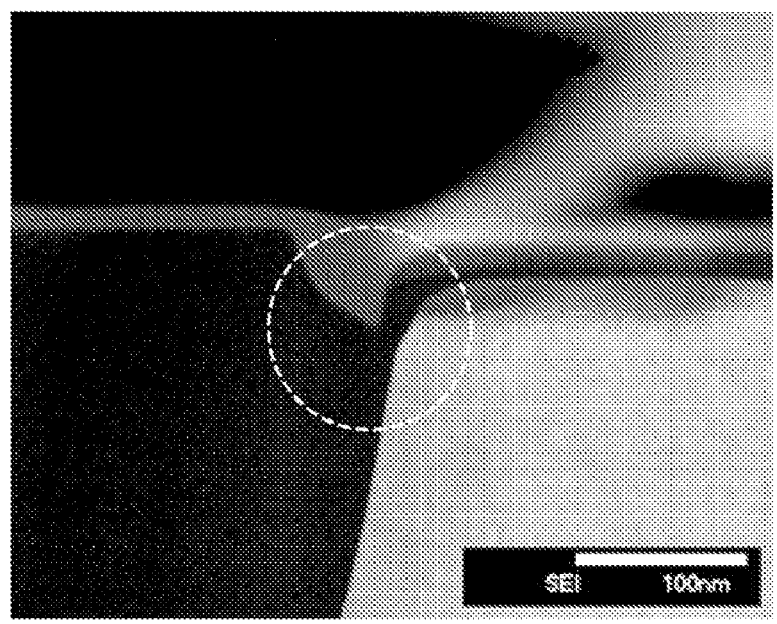
FIG. 30A is a TEM image illustrating a cross-sectional shape of an end portion of an isolation film of a sample which is not processed by an operation of removing a fluorocarbon film.
Figure 30B:
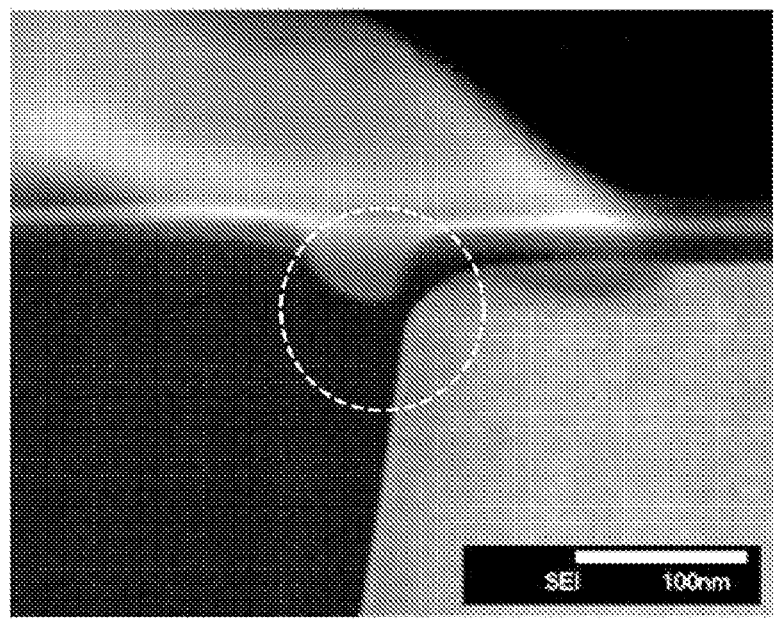
FIG. 30B is a TEM image illustrating a cross-sectional shape of an end portion of an isolation film of a sample which is processed by an operation of removing a fluorocarbon film.
Figure 31:
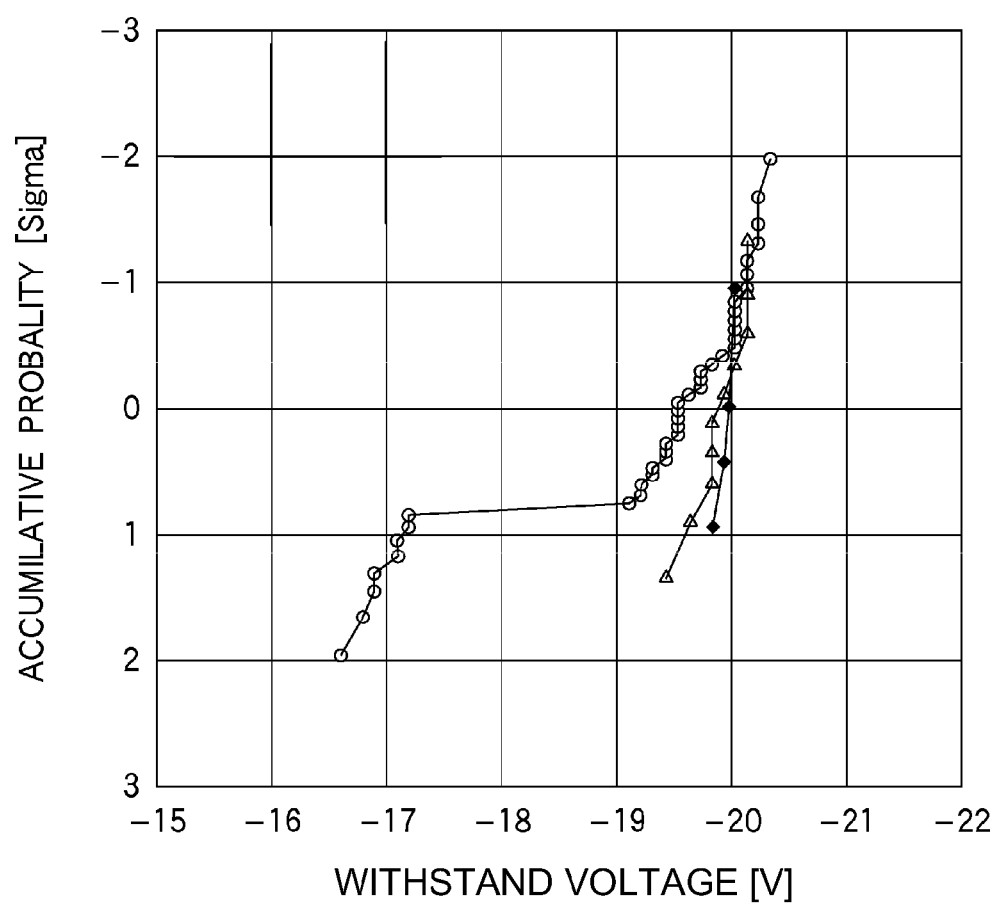
FIG. 31 is a graph illustrating the accumulative probability distribution of the withstand voltage of a gate insulating film when a reverse bias is applied to a gate electrode of a high-voltage transistor.

FIG. 1 is a plan view illustrating the structure of a semiconductor device according to this embodiment; FIGS. 2A and 2B are schematic cross-sectional views each illustrating the structure of the semiconductor device according to this embodiment; FIGS. 3A to 28B are cross-sectional views each illustrating an operation of manufacturing the semiconductor device according to this embodiment; FIGS. 29A to 29C are views each illustrating influence of a fluorocarbon film as a residual film during a process of removing an ONO film; FIG. 30A is a TEM image illustrating a cross-sectional shape of an end portion of an isolation film of a sample which is not processed by an operation of removing a fluorocarbon film; FIG. 30B is a TEM image illustrating a cross-sectional shape of an end portion of an isolation film of a sample which is processed by the operation of removing a fluorocarbon film; and FIG. 31 is a graph illustrating the accumulative probability distribution of the withstand voltage of a gate insulating film when a reverse bias is applied to a gate electrode of a high-voltage transistor.

The structure of the semiconductor device according to this embodiment will be first described with reference to FIGS. 1 to 2B. FIG. 2A is a schematic cross-sectional view taken along the line A-A' of FIG. 1, and FIG. 2B is a schematic cross-sectional view taken along the line B-B' of FIG. 1.

The semiconductor device according to this embodiment is semiconductor device including a transistor and a non-volatile memory each having a stack structure. As illustrated in FIG. 1, the semiconductor device has a memory cell region in which non-volatile memories (Flash) are formed in a matrix and a peripheral circuit region in which various peripheral transistors, such as a logic transistor forming a logic circuit and a high-voltage transistor driving a non-volatile memory, are formed. In this embodiment, as the peripheral transistors, it is assumed that a low-voltage transistor (LV-Tr) forming a high speed logic circuit, a medium-voltage transistor (MV-Tr) forming an input output circuit, and a high-voltage transistor (HV-Tr) controlling a non-volatile memory are provided.

The non-volatile memory (Flash) has, as illustrated in FIGS. 1 to 2B, a floating gate 68 formed on a silicon substrate 10 with a tunnel insulating film 34 interposed therebetween, a control gate 70 which is formed on the floating gate 68 with an ONO film 42 interposed therebetween and which is also used as a word line, and source/drain regions 98 formed in the silicon substrate 10 at two sides of the control gate 70. The floating gate 68 may be formed on the silicon substrate 10, or the floating gate 68 may be formed over the silicon substrate 10. The non-volatile memory may be formed on the silicon substrate 10, or the non-volatile memory may be formed on the silicon substrate 10.

The low-voltage transistor (LV-Tr) has, as illustrated in FIGS. 1 to 2B, a gate electrode 86 formed on the silicon substrate 10 with a gate insulating film 54 interposed therebetween, and source/drain regions 96 formed in the silicon substrate 10 at two sides of the gate electrode 86.

The medium-voltage transistor (MV-Tr) has, as illustrated in FIGS. 1 to 2B, a gate electrode 86 formed on the silicon substrate 10 with a gate insulating film 56 interposed therebetween, and source/drain regions 96 formed in the silicon substrate 10 at two sides of the gate electrode 86.

The high-voltage transistor (HV-Tr) has, as illustrated in FIGS. 1 to 2B, a gate electrode 86 formed on the silicon substrate 10 with a gate insulating film 58 interposed therebetween, and source/drain regions 96 formed in the silicon substrate 10 at two sides of the gate electrode 86.

The thickness of the gate insulating film of the peripheral transistor is increased in accordance with the withstand voltage of each transistor, that is, the thicknesses of the gate insulating films 54, 56, and 58 are increased in this order.

In this embodiment, although one low-voltage transistor (LV-Tr), one medium-voltage transistor (MV-Tr), and one high-voltage transistor (HV-Tr) are only illustrated, n-type and p-type conduction transistors are practically included in each transistor. In addition, transistors having different threshold voltages may also be used in some cases.

Next, the method of manufacturing a semiconductor device according to this embodiment will be described with reference to FIGS. 3A to 28B. In each figure, A is a cross-sectional view illustrating an operation of manufacturing the peripheral circuit region (corresponding to the cross-sectional view taken along the line A-A' of FIG. 1), and B is a cross-sectional view illustrating an operation of manufacturing the memory cell region (corresponding to the cross-sectional view taken along the line B-B' of FIG. 1).

First, the surface of the silicon substrate 10 is thermally oxidized, for example, by a thermal oxidation method, so that a silicon oxide film 12 having a thickness of, for example, approximately 8 nm to 16 nm is formed. The silicon oxide film 12 may be formed on the silicon substrate 10, or the silicon oxide film 12 may be formed over the silicon substrate 10.

Next, a silicon nitride film 14 having a thickness of, for example, 55 nm to 130 nm is formed on the silicon oxide film 12, for example, by a thermal chemical vapor deposition (CVD) method performed at a temperature of 700° C. to 900° C. The silicon nitride film 14 may be formed on the silicon oxide film 12, or the silicon nitride film 14 may be formed over the silicon oxide film 12.

Subsequently, a polysilicon film 16 having a thickness of, for example, 60 nm to 120 nm is formed on the silicon nitride film 14, for example, by a thermal CVD method performed at a temperature of 550° C. to 680° C.

A bottom anti-reflective coating (BARC) film 18 and a photoresist film 20 are then formed on the polysilicon film 16 by a spin coating method.

Figure 3A:
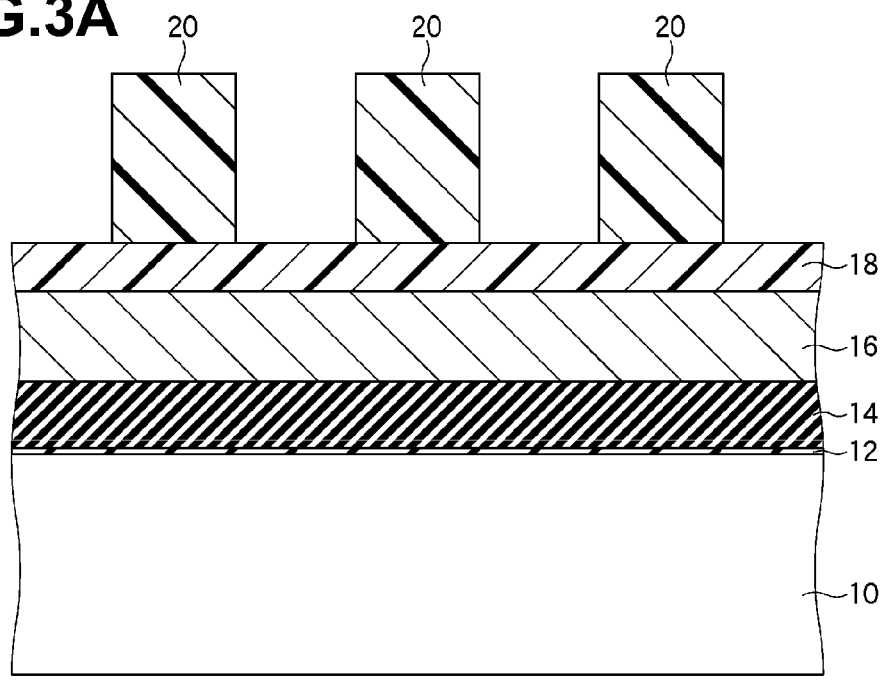
FIGS. 3A-3B are cross-sectional views each illustrating an operation of a method of manufacturing the semiconductor device according to the first embodiment (part 1)
Figure 3B:
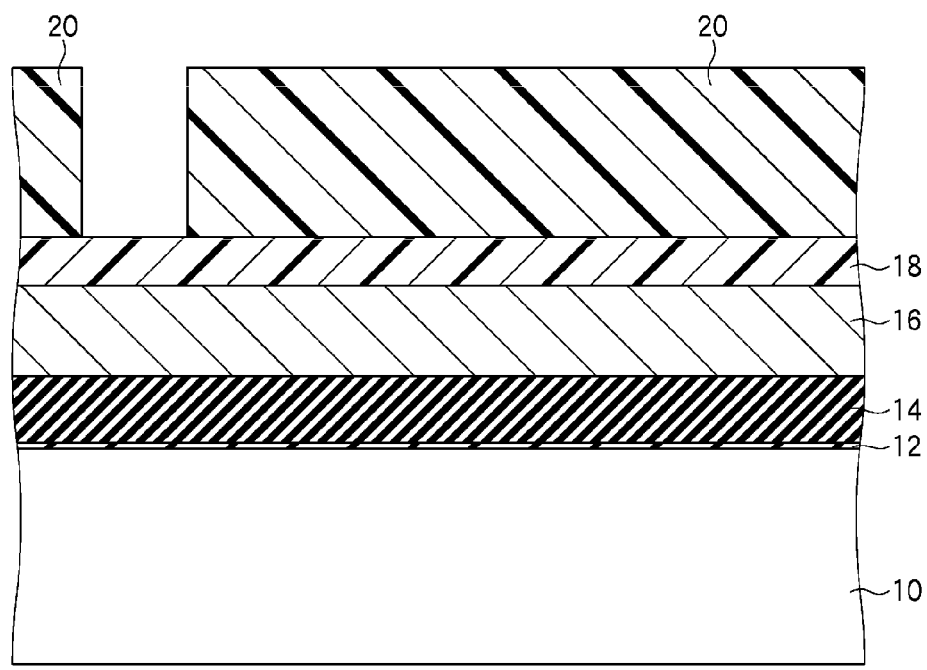

Subsequently, by photolithography, opening portions exposing regions where the isolation films are to be formed are formed (FIGS. 3A and 3B).

Figure 4A:
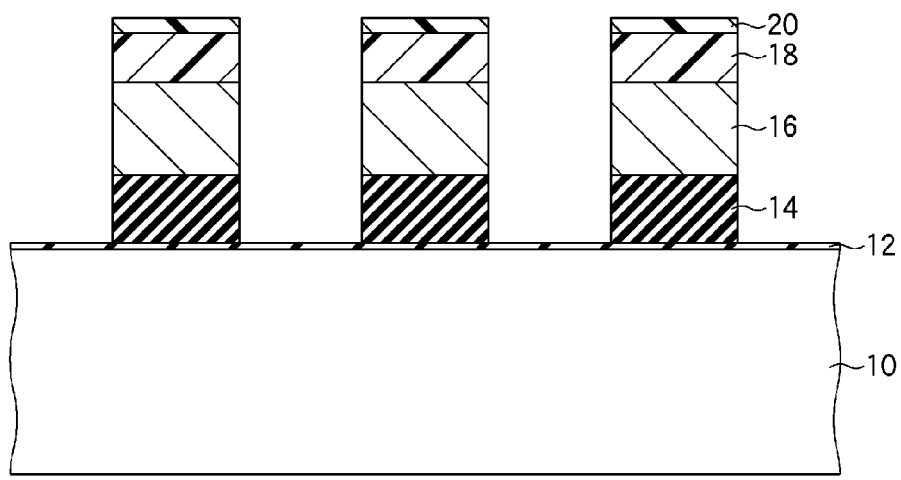
FIGS. 4A-4B are cross-sectional views each illustrating an operation of the method of manufacturing the semiconductor device according to the first embodiment (part 2)
Figure 4B:
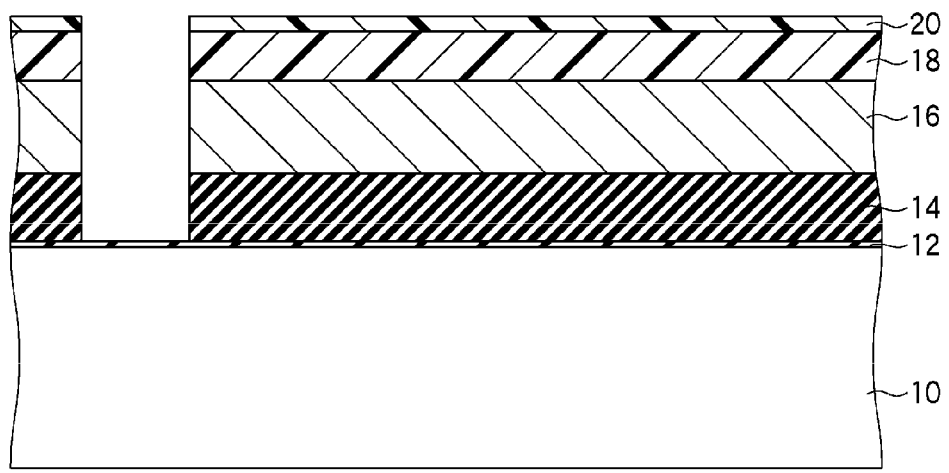

Next, by using the photoresist film 20 as a mask, the BARC film 18, the polysilicon film 16, and the silicon nitride film 14 are patterned by dry etching, so that the pattern of the photoresist film 20 is transferred to the polysilicon film 16 and the silicon nitride film 14 (FIGS. 4A and 4B).

The polysilicon film 16 is a film to be used as a hard mask when the silicon nitride film 14 is patterned. When the silicon nitride film 14 may be sufficiently patterned only by the photoresist film 20, it is not always necessary to form the polysilicon film 16.

Figure 5A:
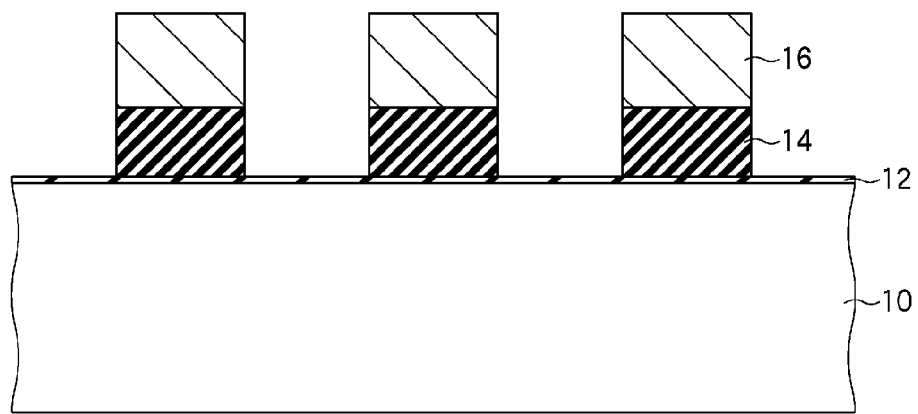
FIGS. 5A-5B are cross-sectional views each illustrating an operation of the method of manufacturing the semiconductor device according to the first embodiment (part 3)
Figure 5B:
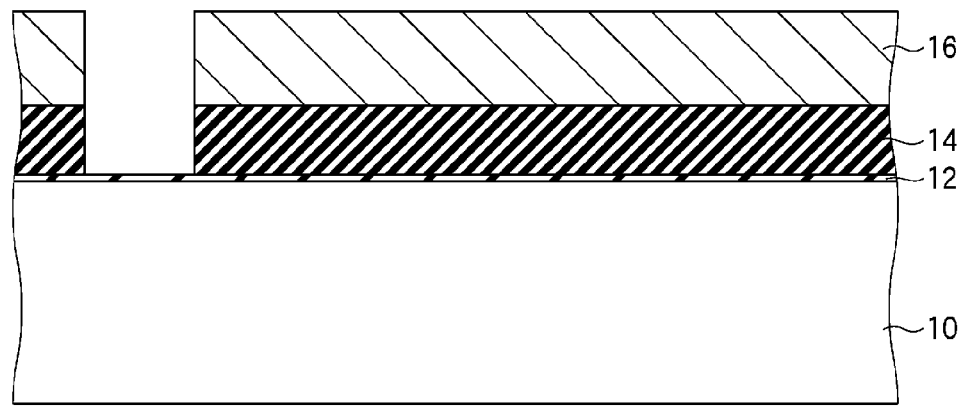

Next, by ashing and a subsequent post-treatment, the BARC film 18 and the photoresist film 20 remaining on the polysilicon film 16 are removed (FIGS. 5A and 5B).

Figure 6A:
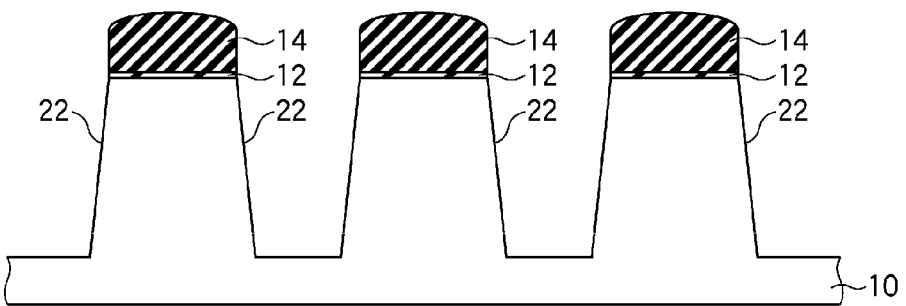
FIGS. 6A-6B are cross-sectional views each illustrating an operation of the method of manufacturing the semiconductor device according to the first embodiment (part 4)
Figure 6B:
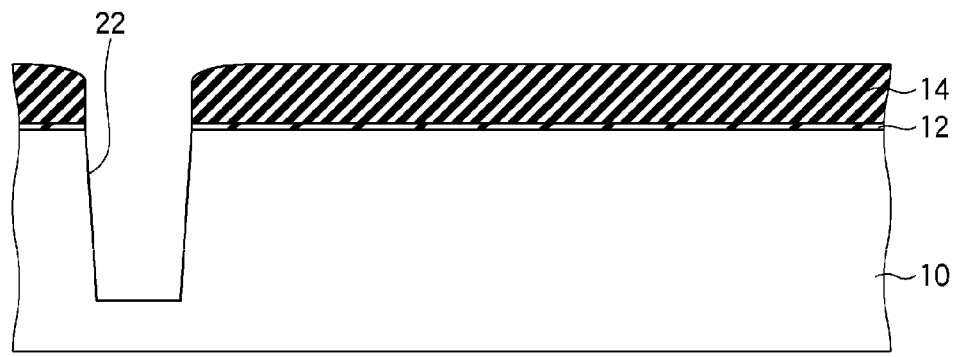

Subsequently, the silicon oxide film 12 and the silicon substrate 10 are etched by using the patterned polysilicon film 16 and silicon nitride film 14 as a mask, so that trenches 22 for element isolation are formed in the silicon substrate 10 (FIGS. 6A and 6B). In addition, the polysilicon film 16 is removed when the silicon substrate 10 is etched.

Next, an appropriate post-treatment is performed whenever necessary, so that byproducts generated by the etching and adhering to the surface of the silicon substrate 10 are removed.

For example, by a thermal oxidation method, the silicon substrate 10 is then thermally oxidized using the silicon nitride 14 as a mask, so that a silicon oxide film 24 having a thickness of, for example, 1 nm to 18 nm is formed inside the trench 22.

Figure 7A:
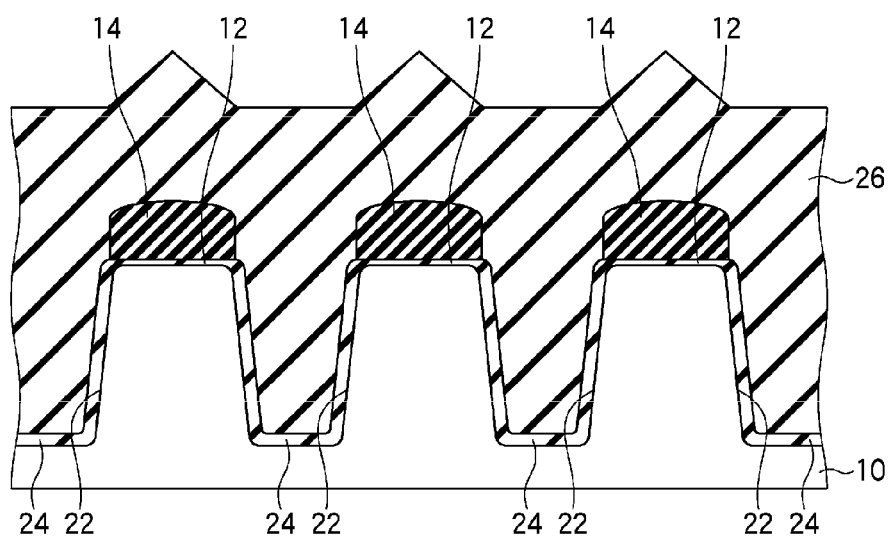
FIGS. 7A-7B are cross-sectional views each illustrating an operation of the method of manufacturing the semiconductor device according to the first embodiment (part 5)
Figure 7B:
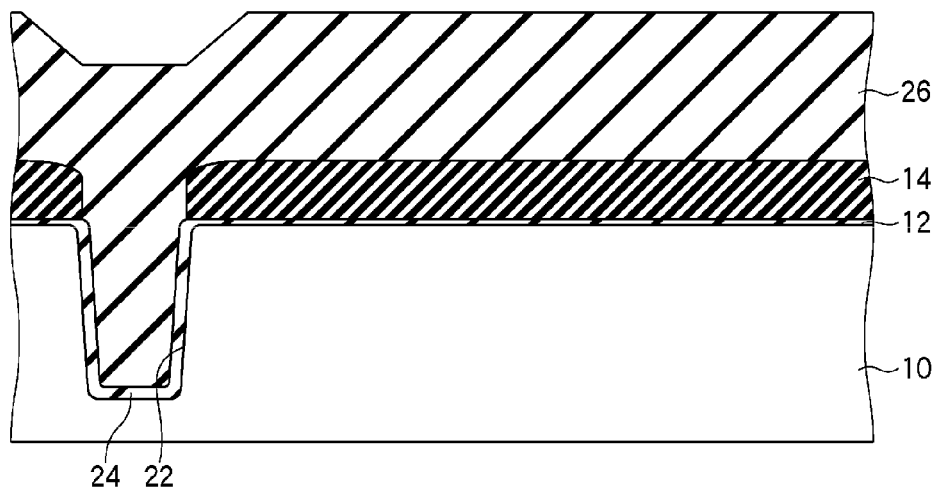

Subsequently, a silicon oxide film 26 having a thickness of, for example, 250 nm to 750 nm is formed on the entire surface, for example, by a high density plasma (HDP) CVD method performed at a temperature of 250° C. to 600° C. (FIGS. 7A and 7B). As a result, the trenches 22 are each totally filled with the silicon oxide film 26.

Figure 8A:
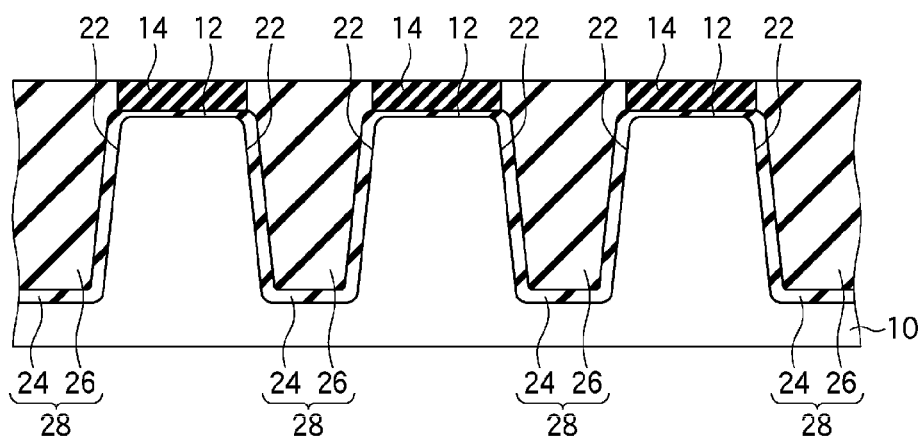
FIGS. 8A-8B are cross-sectional views each illustrating an operation of the method of manufacturing the semiconductor device according to the first embodiment (part 6)
Figure 8B:
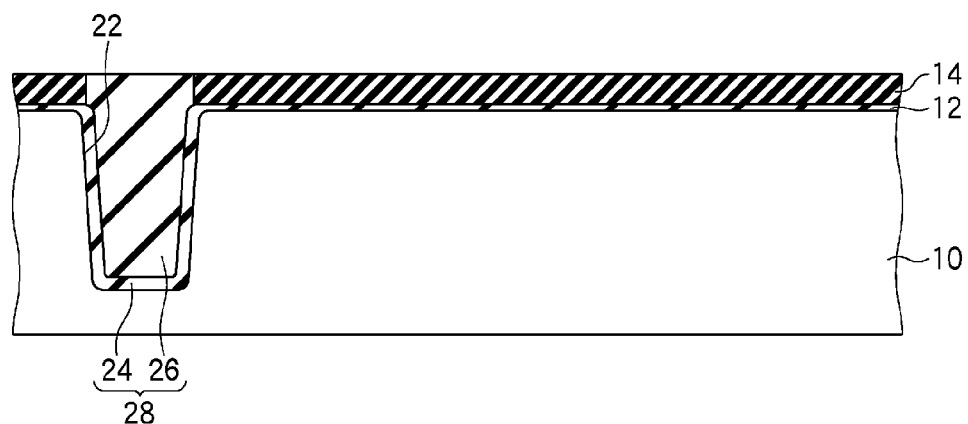

Next, the surface of the silicon oxide film 26 is polished by a chemical mechanical polishing (CMP) method until the surface of the silicon nitride film 14 is exposed, so that the surface is planarized. Accordingly, isolation films 28 composed of the silicon oxide film 24 and 26 are formed (FIGS. 8A and 8B). Hence, a plurality of active regions defined by the isolation films 28 is formed on the surface of the silicon substrate 10.

By an appropriate post-treatment, a slurry used for the CMP was then removed.

Subsequently, in a nitrogen atmosphere, for example, a heat treatment is performed at a temperature of 800° C. to 1,100° C.

Next, a photoresist film 30 is formed on the entire surface by a spin coating method and is then patterned by photolithography so as to cover the peripheral circuit region and so as to expose the memory cell region.

Figure 9A:
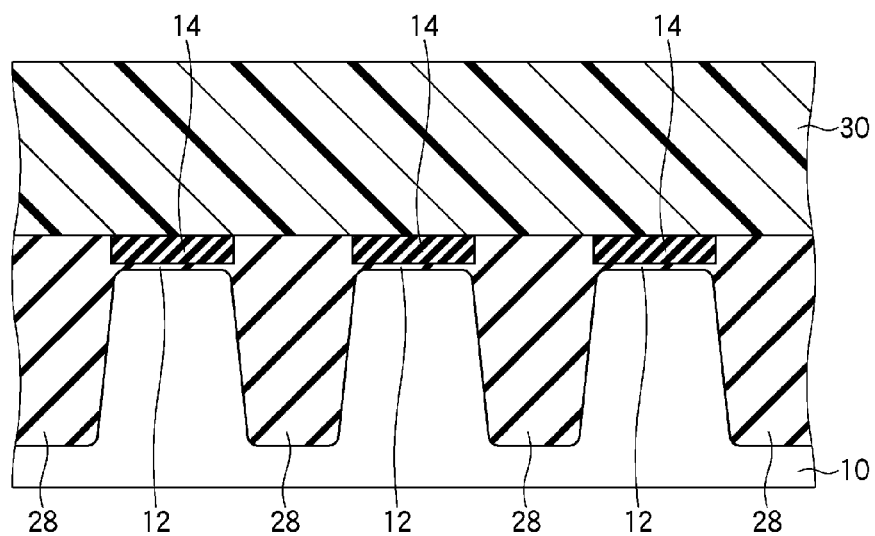
FIGS. 9A-9B are cross-sectional views each illustrating an operation of the method of manufacturing the semiconductor device according to the first embodiment (part 7)
Figure 9B:
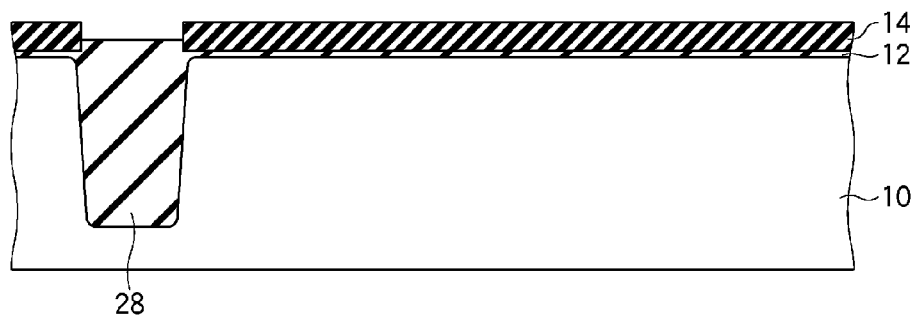

Next, by using the photoresist film 30 as a mask, for example, wet etching using an aqueous hydrofluoric acid solution is performed, so that the upper surface of the isolation film 28 is etched by, for example, approximately 10 nm to 80 nm, (FIGS. 9A and 9B).

Subsequently, for example, wet etching is performed using an aqueous hydrofluoric acid solution diluted with pure water at a ratio of approximately 10:1 to 200:1, so that a native oxide film (not illustrated) on the silicon nitride film 14 is removed.

Next, for example, wet etching using a phosphoric acid solution at a temperature of 130° C. is performed, so that the silicon nitride film 14 is removed.

For example, by wet etching using an aqueous hydrofluoric acid solution, the silicon oxide film 12 is then removed.

Figure 10A:
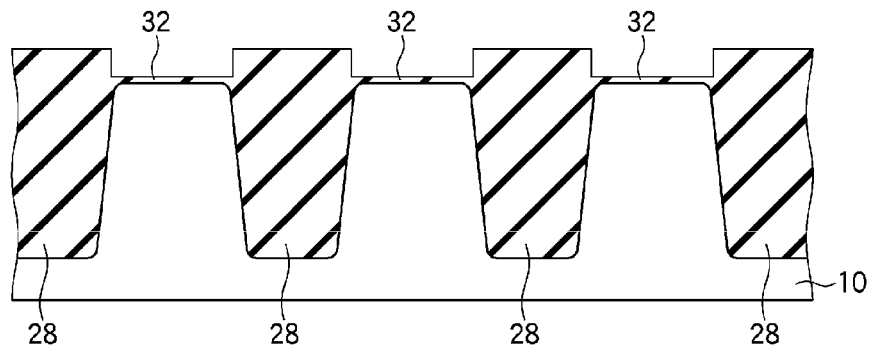
FIGS. 10A-10B are cross-sectional views each illustrating an operation of the method of manufacturing the semiconductor device according to the first embodiment (part 8)
Figure 10B:
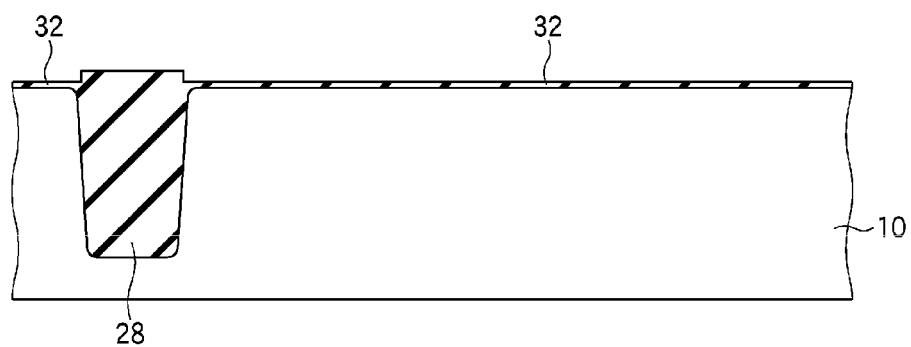

Next, a silicon oxide film having a thickness of, for example, 8 nm to 16 nm is formed on the surface of the silicon substrate 10, for example, by a thermal oxidation method. As a result, a sacrifice oxide film 32 composed of a silicon oxide film for ion implantation is formed (FIGS. 10A and 10B).

Subsequently, by photolithography and ion implantation, predetermined wells (not illustrated) are formed in the memory cell region and the high-voltage transistor forming region. For example, double wells in which a p-type well is formed in an n-type well are formed in the memory cell region and an n-type high-voltage transistor forming region, and an n-type well is formed in a p-type high-voltage transistor forming region. The n-type well is formed by performing ion implantation using, for example, phosphorous ions under the conditions in which, for example, the acceleration energy is set to 300 keV to 500 keV, and the dose amount is set to $1\times10^{11}$ cm$^{-2}$ to $1\times10^{14}$ cm$^{-2}$. The p-type well is formed by performing ion implantation using, for example, boron ions under the conditions in which, for example, the acceleration energy is set to 100 keV to 350 keV, and the dose amount is set to $1\times10^{12}$ cm$^{-2}$ to $1\times10^{15}$ cm$^{-2}$. An n-type buried layer at the bottom of the double well is formed by performing ion implantation using, for example, phosphorous ions under the conditions in which, for example, the acceleration energy is set to 1.6 MeV to 2.6 MeV, and the dose amount is set to $2\times10^{11}$ cm$^{-2}$ to $2\times10^{15}$ cm$^{-2}$.

Next, in a nitrogen atmosphere, for example, a heat treatment is performed at a temperature of 900° C. to 1,200° C. for 1 second to 15 seconds, so that the implanted impurities are activated.

Subsequently, for example, wet etching is performed using an aqueous hydrofluoric acid solution diluted with pure water at a ratio of approximately 10:1 to 200:1, so that the sacrifice oxide film 32 is removed.

In addition, the thickness of the isolation film 28 is gradually decreased, for example, by the operations of removing the silicon oxide film 12 and the sacrifice oxide film 32. As a result, after the sacrifice oxide film 32 is removed, a recess which is recessed from the surface of the active region is formed at the boundary between the isolation film 28 and the active region.

Figure 11A:
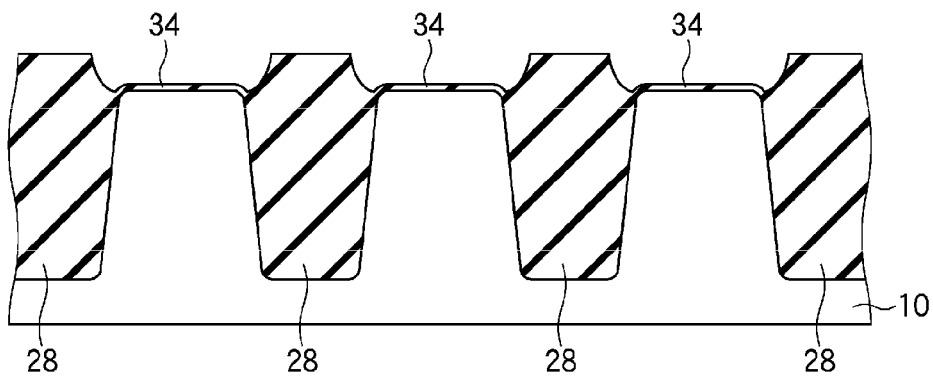
FIGS. 11A-11B are cross-sectional views each illustrating an operation of the method of manufacturing the semiconductor device according to the first embodiment (part 9)
Figure 11B:
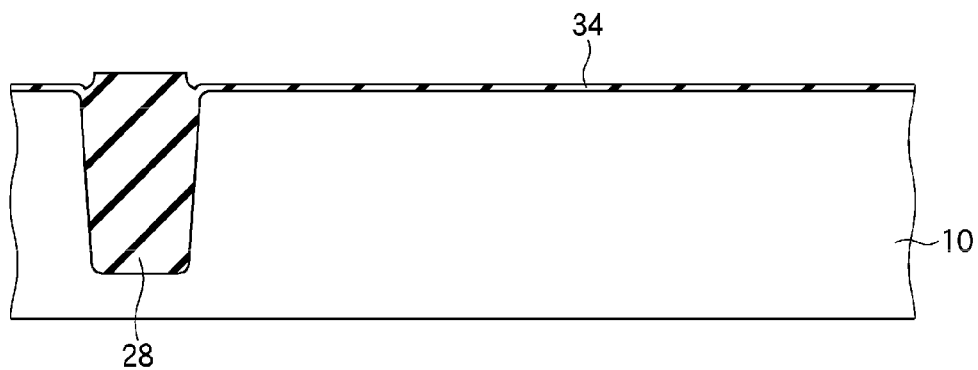

The tunnel insulating film 34 composed of a silicon oxide film having a thickness of, for example, 3 nm to 15 nm is then formed on the surface of the silicon substrate 10 (FIGS. 11A and 11B). The tunnel insulating film 34 is formed, for example, by radical oxidation at a temperature of 300° C. to 550° C., and/or a thermal oxidation at a temperature of 850° C. to 1,100° C. The tunnel insulating film 34 may be formed on the surface of the silicon substrate 10, or the tunnel insulating film 34 may be formed over the surface of the silicon substrate 10.

Figure 12A:
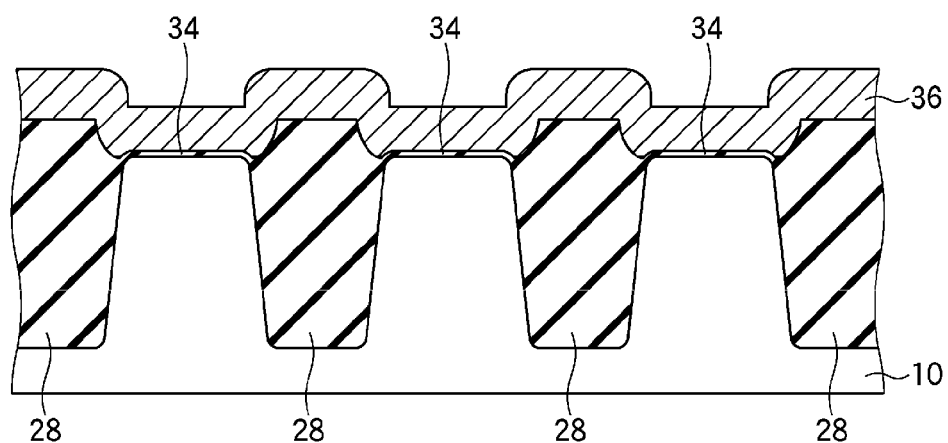
FIGS. 12A-12B are cross-sectional views each illustrating an operation of the method of manufacturing the semiconductor device according to the first embodiment (part 10)
Figure 12B:
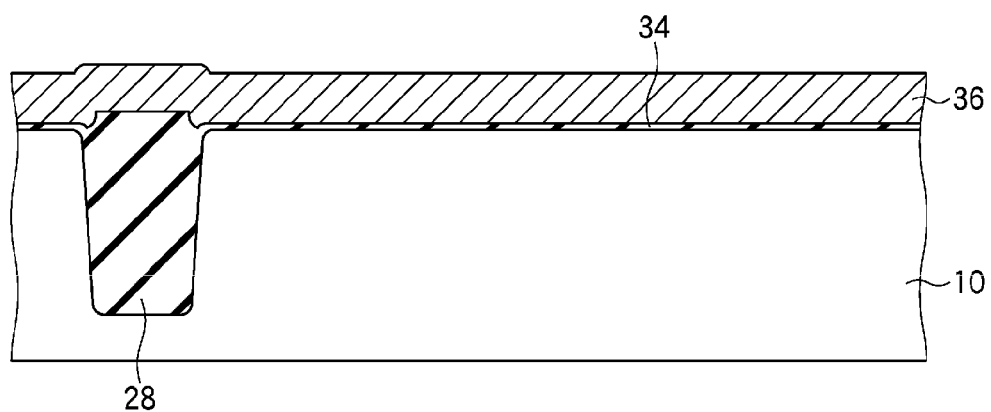

Subsequently, an amorphous silicon film 36 is formed on the entire surface of the silicon substrate 10, for example, by a CVD method so as to have a thickness of, for example, 50 nm to 100 nm and to include phosphorous at a concentration of, for example, $0.2\times10^{19}$ cm$^{-3}$ to $10\times10^{19}$ cm$^{-3}$ (FIGS. 12A and 12B). The amorphous silicon film 36 is a film to be formed into a floating gate. The amorphous silicon film 36 may be formed on the entire surface, or the amorphous silicon film 36 may be formed over the entire surface of the silicon substrate 10.

A bottom anti-reflective coating (BARC) film 38 and a photoresist film 40 are then formed on the amorphous silicon film 36 by a spin coating method.

Figure 13A:
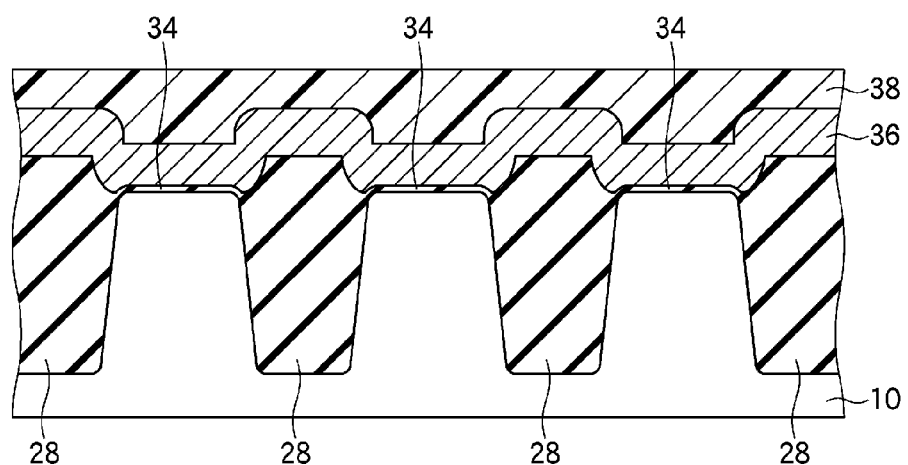
FIGS. 13A-13B are cross-sectional views each illustrating an operation of the method of manufacturing the semiconductor device according to the first embodiment (part 11)
Figure 13B:
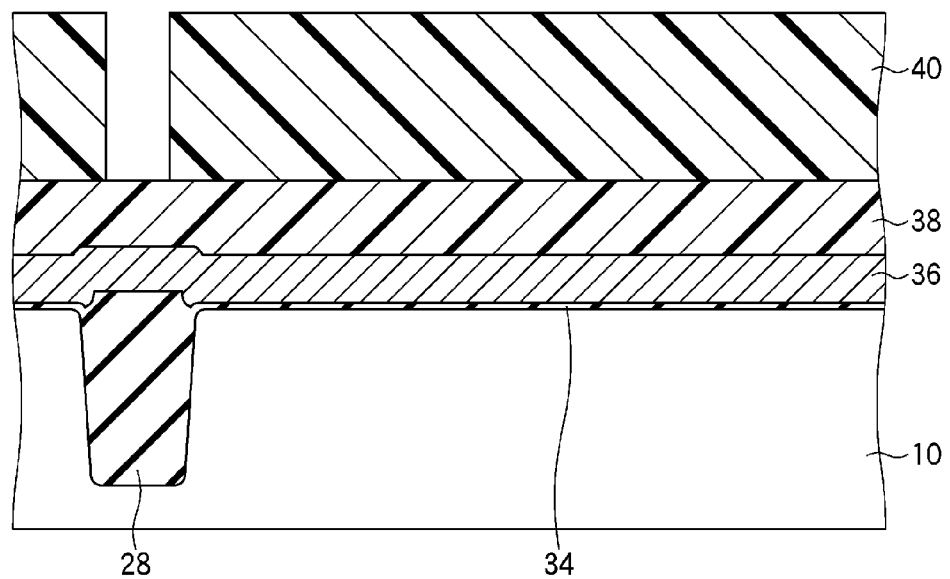

Next, the photoresist film 40 in the peripheral circuit region is removed, and an opening portion exposing a predetermined region in the memory cell region is formed in the photoresist film 40 by photolithography (FIGS. 13A and 13B). The predetermined region in the memory cell region is a region at which a word line (control gate) forming region and an isolation region are overlapped with each other and which corresponds to a region for separating the floating gates in an extending direction of the word line.

Figure 14A:
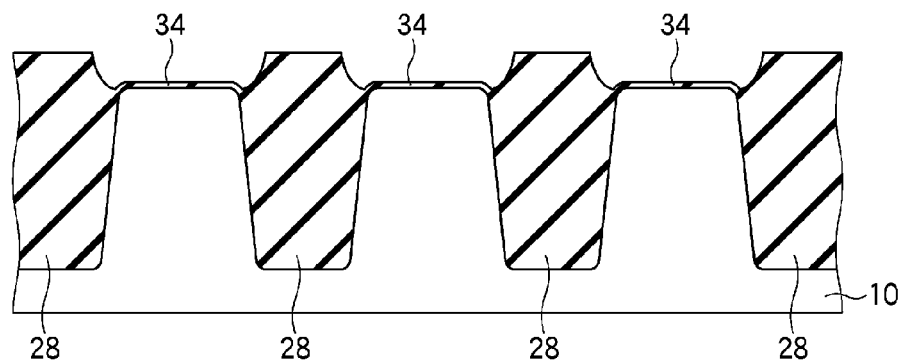
FIGS. 14A-14B are cross-sectional views each illustrating an operation of the method of manufacturing the semiconductor device according to the first embodiment (part 12)
Figure 14B:
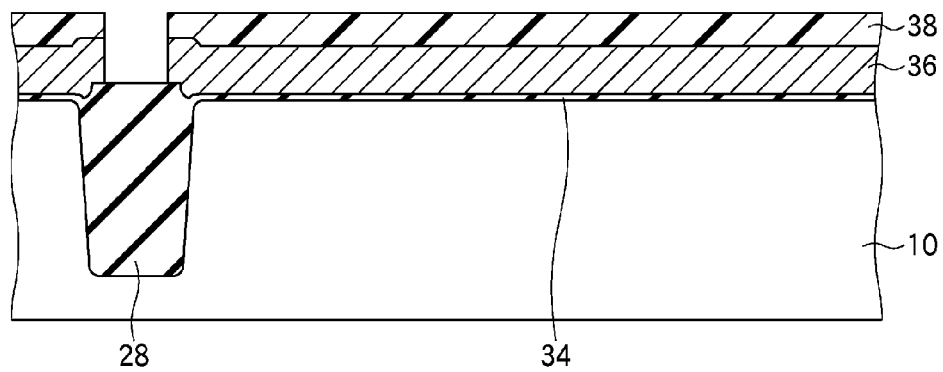

Next, by using the photoresist film 40 as a mask, for example, anisotropic etching is performed in an inductively coupled plasma etching apparatus, so that the amorphous silicon film 36 is patterned (FIGS. 14A and 14B).

Next, by ashing and a subsequent post-treatment, the BARC film 38 and the photoresist film 40 remaining on the amorphous silicon film 36 are removed.

Figure 15A:
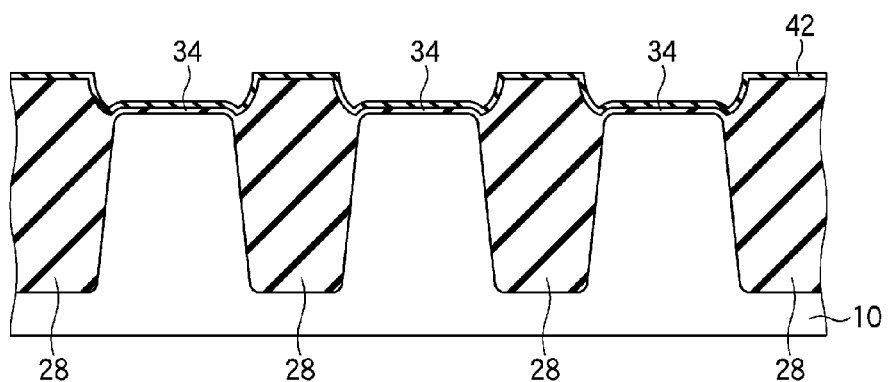
FIGS. 15A-15B are cross-sectional views each illustrating an operation of the method of manufacturing the semiconductor device according to the first embodiment (part 13)
Figure 15B:
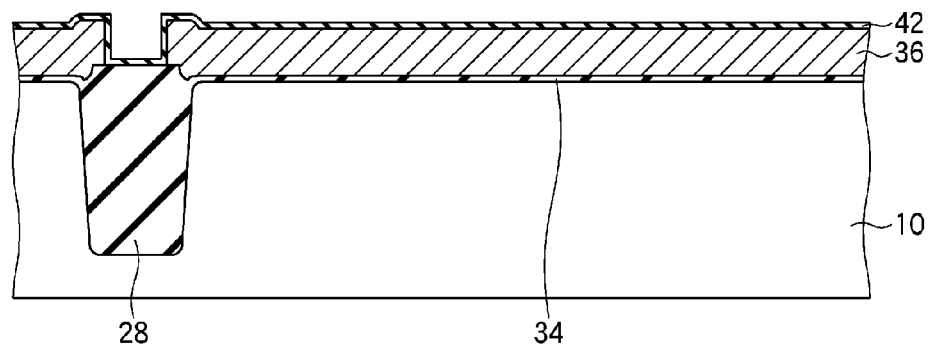

Next, the ONO film 42 having a multilayer structure of a silicon oxide film, a silicon nitride film, and a silicon oxide film is formed on the entire surface of the silicon substrate 10 (FIGS. 15A and 15B). The ONO film 42 is a film insulating the floating gate from the control gate for capacitive coupling. The ONO film 42 is formed by the operations of forming a silicon oxide film (bottom oxide film) having a thickness of, for example, 3 nm to 5 nm by, for example, a thermal CVD method at a temperature of 500° C. to 900° C., forming a silicon nitride film having a thickness of, for example, 5 nm to 10 nm by, for example, a thermal CVD method at a temperature of 300° C. to 900° C., and then forming a silicon oxide (top oxide film) film having a thickness of, for example, approximately 3 nm to 8 nm by, for example, thermal oxidation at a temperature of 800° C. to 1,100° C. The ONO film 42 may be formed on the silicon substrate 10, or the ONO film 42 may be formed over the silicon substrate 10.

By photolithography and ion implantation, predetermined wells (not illustrated) are then formed in a low-voltage transistor forming region and a medium-voltage transistor forming region. For example, p-type wells are formed in an n-type low-voltage transistor forming region and an n-type medium-voltage transistor forming region, and n-type wells are formed in a p-type low-voltage transistor forming region and a p-type medium-voltage transistor forming region.

Next, a photoresist film 44 is formed on the entire surface of the silicon substrate 10 by a spin coating method and is then patterned by photolithography so as to expose the peripheral circuit region and so as to cover the memory cell region.

Subsequently, by using the photoresist film 44 as a mask, for example, dry etching is performed in a magnetron reactive ion etching (RIE) apparatus, so that the top oxide film and the silicon nitride film, which is an intermediate layer, of the ONO film 42 are etched.

The thicknesses of the individual films forming the ONO film 42 are each very small, such as 10 nm or less. In addition, since the recess is formed at the boundary between the active region and the isolation film, in order to remove a film formed in the recess (inclined portion), an over-etching amount may be increased to a degree of 300% or more. Accordingly, when the individual films forming the ONO film 42 are etched, the selectivity with respect to the underlayer may be sufficiently ensured.

In view of the above point, for example, a mixed gas including some of $C_4F_8$, $C_4F_6$, Ar, and $O_2$ in combination is used as an etching gas to etch the top oxide film, and etching is performed under conditions in which the selectivity with respect to the silicon nitride film as an underlayer is approximately 6.0 or more. In addition, in order to etch the silicon nitride film, which is the intermediate layer, a mixed gas including some of $CH_3F$, Ar, and $O_2$ in combination is used, and etching is performed under conditions in which the selectivity with respect to the bottom oxide film as an underlayer is approximately 9.0 or more.

Under the above etching conditions using a fluorocarbon-based etching gas, as the etching proceeds, a fluorocarbon film as the residual film formed as a by product is deposited on the surface of the substrate. The fluorocarbon film may be deposited on the substrate, or the fluorocarbon film may be deposited over the substrate.

Next, the fluorocarbon film as the residual film deposited on the surface of the substrate is removed by any one of the following methods. The fluorocarbon film as the residual film may be deposited on the surface of the substrate, or the fluorocarbon film as the residual film may be deposited over the surface of the substrate.

According to a first method, the substrate is exposed to a mixed gas including an Ar gas and an oxygen gas in a magnetron RIE apparatus, so that the fluorocarbon film is removed. When the fluorocarbon formed as a byproduct of etching is irradiated with argon beams, fluorine elements are removed, and as a result, a carbon-rich film is formed. When oxygen is allowed to react with this film, the fluorocarbon film may be removed. This method provides advantage in that the treatment may be sequentially performed in the same apparatus following the etching of the top oxide film and the silicon nitride film of the ONO film 42.

As the particular conditions, for example, the RF power is 100 W to 300 W, the pressure is 40 millitorr to 100 millitorr, the total flow rate of the process gas is 100 sccm to 600 sccm, the gas mixing ratio of $Ar:O_2$ is 100:1 to 100:15, the electrode temperature is 50° C., and the process time is 10 seconds to 60 seconds.

The addition amount of an oxygen gas is set in the range of 0.5% to 25% and preferably in the range of approximately 0.5% to 10% with respect to the total flow rate of the process gas. The reasons for this are that when the addition amount of oxygen is less than 0.5%, an effect of removing a fluorocarbon film may not be sufficiently obtained, and when the addition amount of oxygen is more than 25%, ashing of the photoresist film 44 becomes significant. Since the photoresist film 44 is also used as a mask film in the following wet etching operation for removing the bottom oxide film, the photoresist film 44 may have a sufficient thickness for the following wet etching even after the fluorocarbon film is removed.

According to a second method, chemical dry etching is performed to remove the fluorocarbon film using a mixed gas including an oxygen gas, a $CF_4$ gas, and a forming gas (mixed gas including 3% of hydrogen and 97% of nitrogen, hereinafter referred to as "FG" in some cases) in a downflow etching apparatus. The $CF_4$ gas enhances the reactivity of oxygen radicals to the fluorocarbon film and also functions to promote etching of the fluorocarbon film. In addition, the forming gas functions to increase life of oxygen radicals.

As the particular conditions, for example, the microwave power is 800 W to 1,100 W, the pressure is 150 Pa to 300 Pa, the total flow rate of the process gas is 1,200 sccm to 2,000 sccm, the gas mixing ratio of $O_2:CF_4:FG$ is 617:374:1 to 61:38:1, and the process time is 10 seconds to 33 seconds.

The addition amount of the $CF_4$ gas is set in the range of 0.05% to 3% and preferably in the range of approximately 0.1% to 1% with respect to the total flow rate of the process gas. The reasons for this are that when the addition amount of the $CF_4$ gas is less than 0.05%, the effect of removing a fluorocarbon film may not be sufficiently obtained since the reactivity of oxygen radicals is too low, and when the addition amount of the $CF_4$ gas is more than 3%, ashing of the photoresist film 44 becomes significant since the reactivity of oxygen radicals is too high.

The purpose and the effect of the operation of removing a fluorocarbon film will be described later.

Figure 16A:
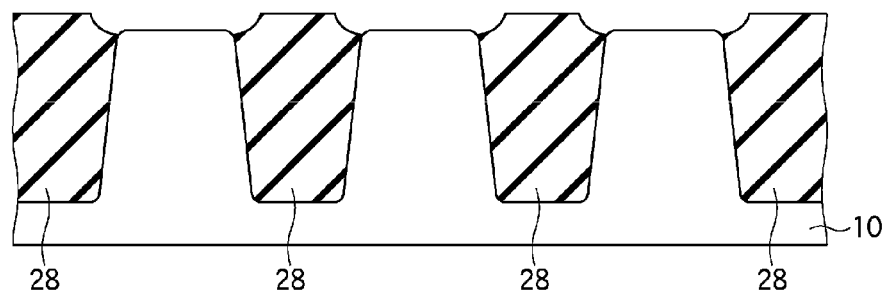
FIGS. 16A-16B are cross-sectional views each illustrating an operation of the method of manufacturing the semiconductor device according to the first embodiment (part 14)
Figure 16B:
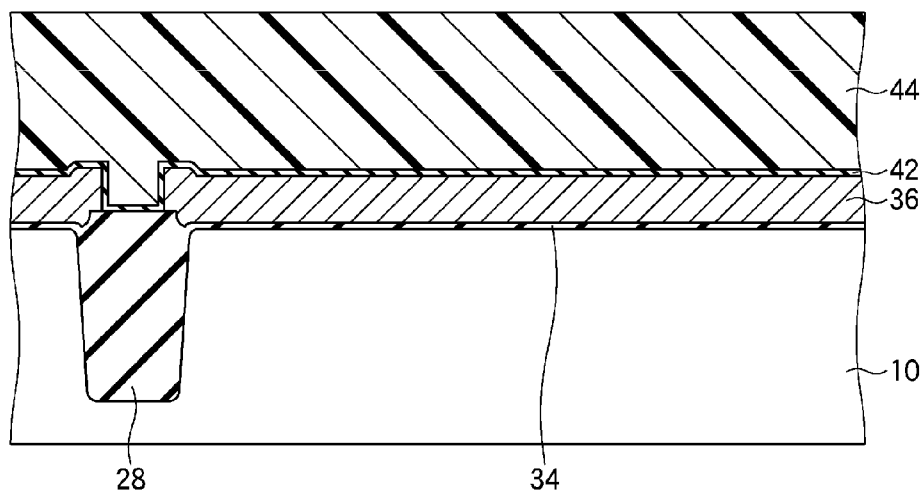

Next, by using the photoresist film 44 as a mask, for example, wet etching is performed by an aqueous hydrofluoric acid solution diluted with pure water at a ratio of approximately 100:1 to 200:1, so that the bottom oxide film of the ONO film 42 and the tunnel insulating film 34 are removed (FIGS. 16A and 16B).

By ashing and a subsequent post-treatment, the photoresist film 44 is then removed.

Figure 17A:
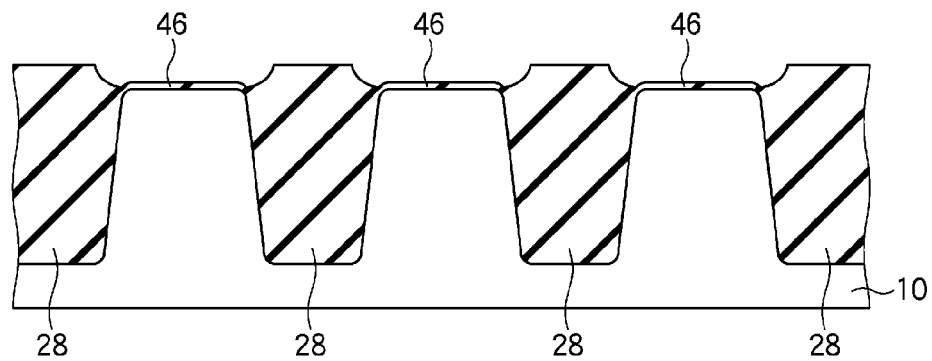
FIGS. 17A-17B are cross-sectional views each illustrating an operation of the method of manufacturing the semiconductor device according to the first embodiment (part 15)
Figure 17B:
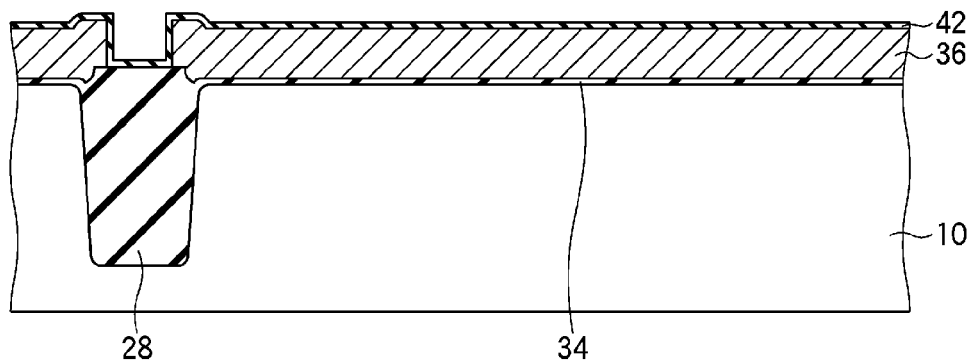

Next, for example, by a thermal oxidation method, a silicon oxide film 46 having a thickness of, for example, 3 nm to 20 nm is formed on the surface of the silicon substrate 10 in the peripheral circuit region (FIGS. 17A and 17B).

Subsequently, a photoresist film 48 is formed on the entire surface by a spin coating method and is then patterned by photolithography so as to expose the low-voltage transistor forming region and the medium-voltage transistor forming region and so as to cover the high-voltage transistor forming region and the memory cell region.

Figure 18A:
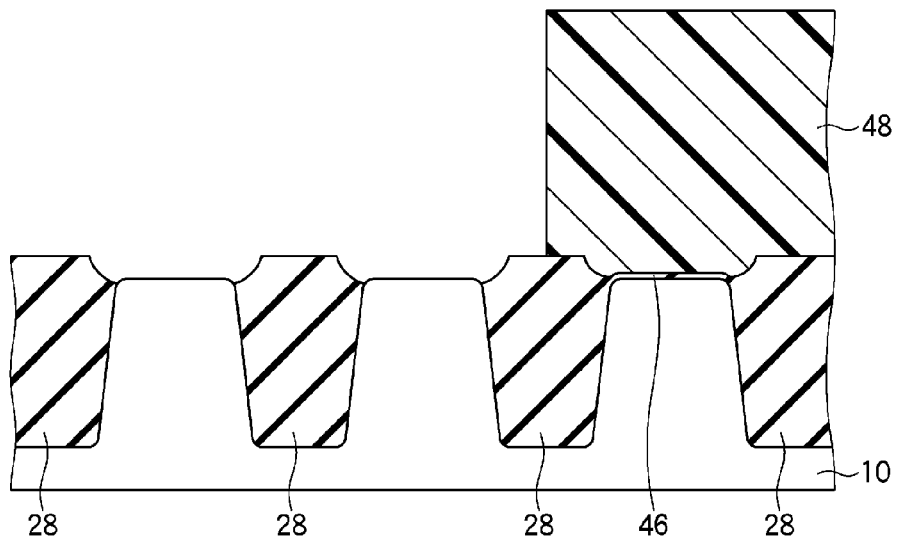
FIGS. 18A-18B are cross-sectional views each illustrating an operation of the method of manufacturing the semiconductor device according to the first embodiment (part 16)
Figure 18B:
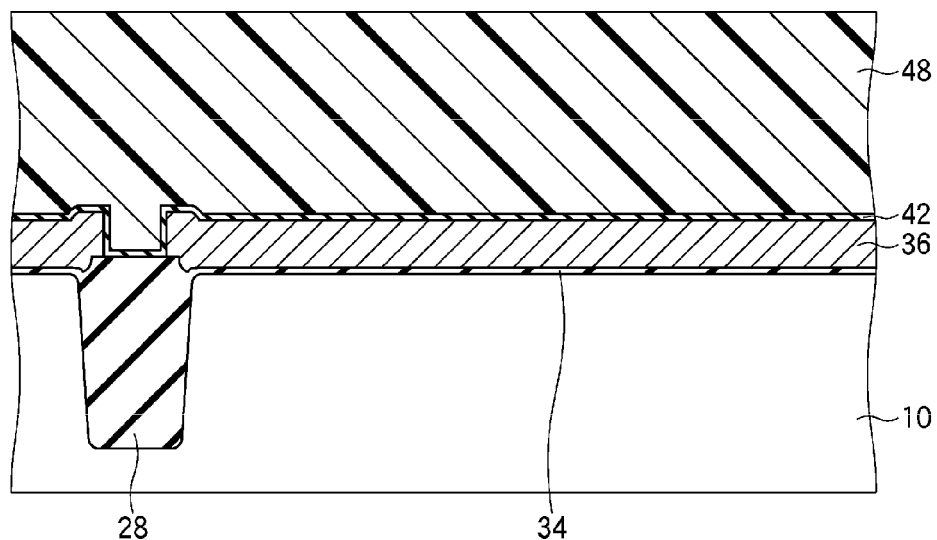

Next, by using the photoresist film 48 as a mask, for example, wet etching is performed by an aqueous hydrofluoric acid solution diluted with pure water at a ratio of approximately 100:1 to 200:1, so that the silicon oxide film 46 in the low-voltage transistor forming region and the medium-voltage transistor forming region is selectively removed (FIGS. 18A and 18B).

By ashing and a subsequent post-treatment, the photoresist 48 is then removed.

Figure 19A:
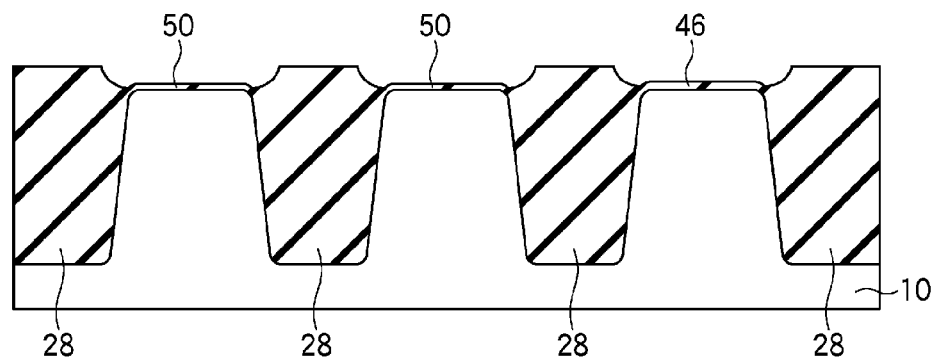
FIGS. 19A-19B are cross-sectional views each illustrating an operation of the method of manufacturing the semiconductor device according to the first embodiment (part 17)
Figure 19B:
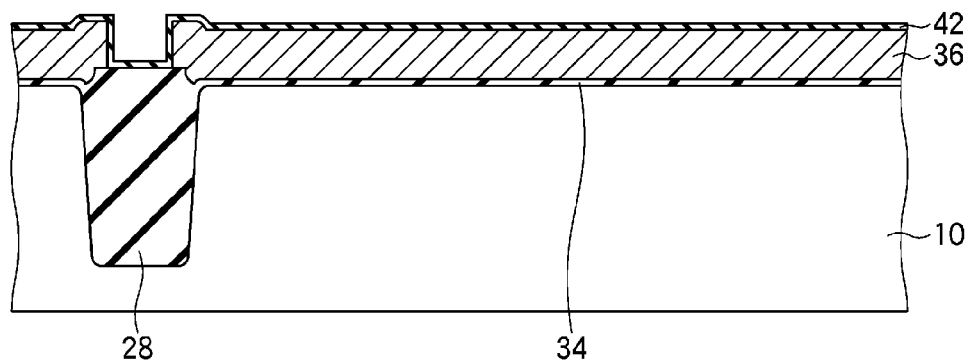

Subsequently, the silicon substrate 10 is thermally oxidized, so that a silicon oxide film 50 having a thickness of, for example, 1 nm to 12 nm is formed in the low-voltage transistor forming region and the medium-voltage transistor forming region (FIGS. 19A and 19B). In this operation, since the silicon oxide film 46 is additionally oxidized, the thickness thereof is increased.

Next, a photoresist film 52 is formed on the entire surface by a spin coating method and is then patterned by photolithography so as to expose the low-voltage transistor forming region and so as to cover the medium-voltage transistor forming region, the high-voltage transistor forming region, and the memory cell region.

Figure 20A:
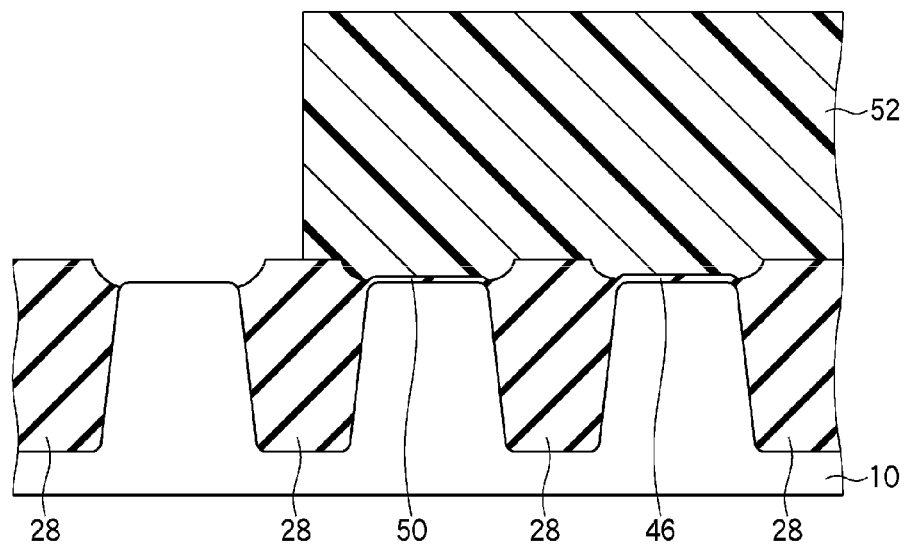
FIGS. 20A-20B are cross-sectional views each illustrating an operation of the method of manufacturing the semiconductor device according to the first embodiment (part 18)
Figure 20B:
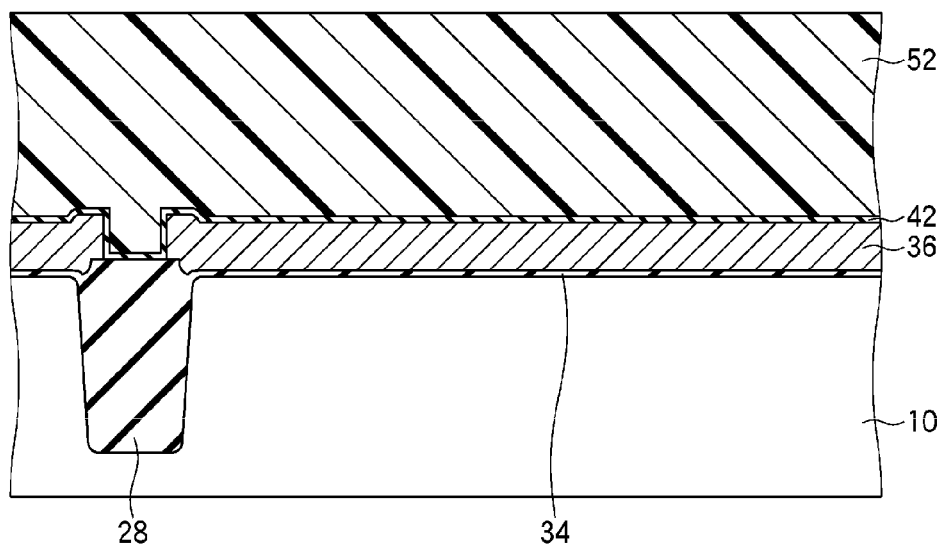

Next, by using the photoresist film 52 as a mask, for example, wet etching is performed by an aqueous hydrofluoric acid solution diluted with pure water at a ratio of approximately 100:1 to 200:1, so that the silicon oxide film 50 in the low-voltage transistor forming region is selectively removed (FIGS. 20A and 20B).

Next, by ashing and a subsequent post-treatment, the photoresist 52 is removed.

Subsequently, the silicon substrate 10 is thermally oxidized, so that the gate insulating film 54 composed of a silicon oxide film having a thickness of, for example, 1 nm to 3 nm is formed in the low-voltage transistor forming region. In this operation, the silicon oxide film 50 is additionally oxidized in the medium-voltage transistor forming region, so that the gate insulating film 56 composed of a silicon oxide film having a thickness of, for example, 2 nm to 15 nm is formed. In addition, the silicon oxide film 46 is further additionally oxidized in the high-voltage transistor forming region, so that the gate insulating film 58 composed of a silicon oxide film having a thickness of, for example, 5 nm to 35 nm is formed. As described above, in the low-voltage transistor forming region, the medium-voltage transistor forming region, and the high-voltage transistor forming region, the three types of gate insulating films 54, 56, and 58 having different thicknesses are formed (FIGS. 21A and 21B), respectively.

Next, a polysilicon film 60 having a thickness of, for example, 50 nm to 110 nm is formed on the entire surface, for example, by a CVD method.

Subsequently, a silicon nitride film 62 having a thickness of 10 nm to 40 nm provided with an oxide film having a thickness of, for example, 3 nm or less on the topmost surface is formed on the polysilicon film 60, for example, by a CVD method.

A BARC film 64 and a photoresist film 66 are then formed on the silicon nitride film 62 by a spin coating method.

Figure 22A:
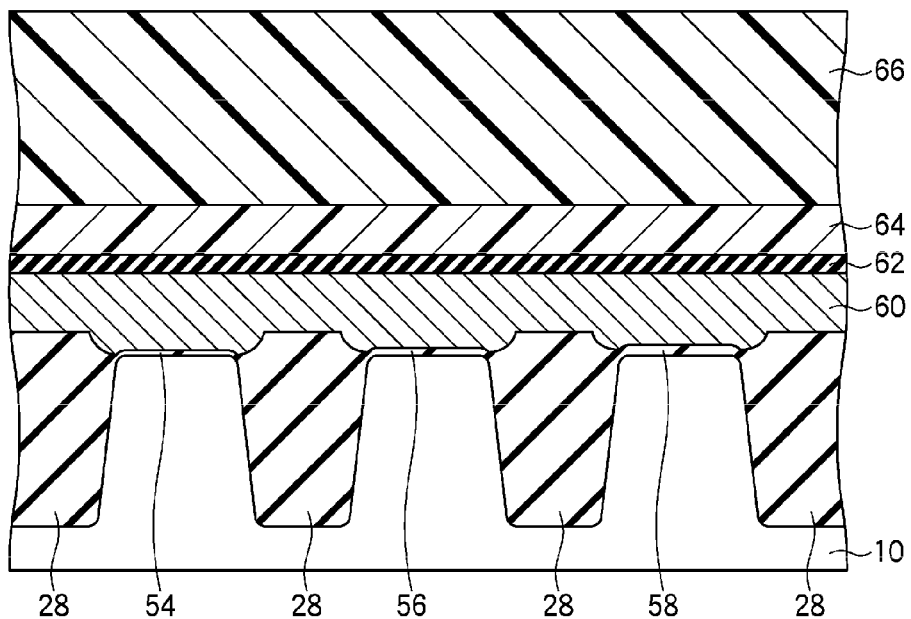
FIGS. 22A-22B are cross-sectional views each illustrating an operation of the method of manufacturing the semiconductor device according to the first embodiment (part 20)
Figure 22B:
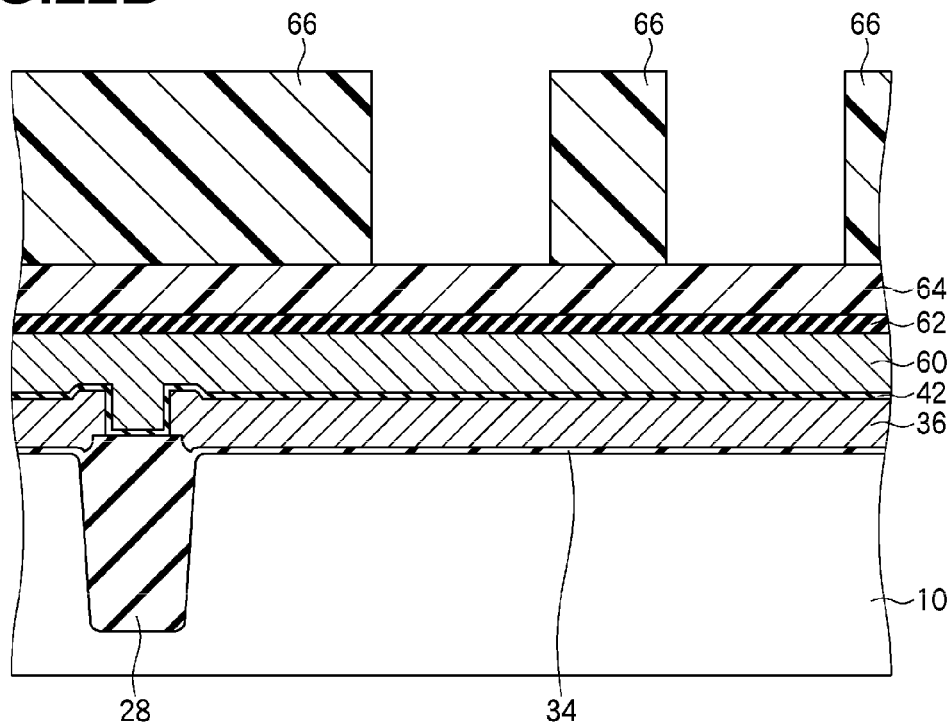

Subsequently, the photoresist film 66 is patterned by photolithography so as to cover the peripheral region and the control gate region in the memory cell region (FIGS. 22A and 22B).

Next, by using the photoresist film 66 as a mask, for example, anisotropic etching is performed in an inductively coupled plasma etching apparatus, so that the BARC film 64, the silicon nitride film 62, the polysilicon film 60, the ONO film 42, and the amorphous silicon film 36 are patterned. As a result, the floating gate 68 composed of the amorphous silicon film 36 and the control gate 70 composed of the polysilicon film 60 are formed in the memory cell region.

Figure 23A:
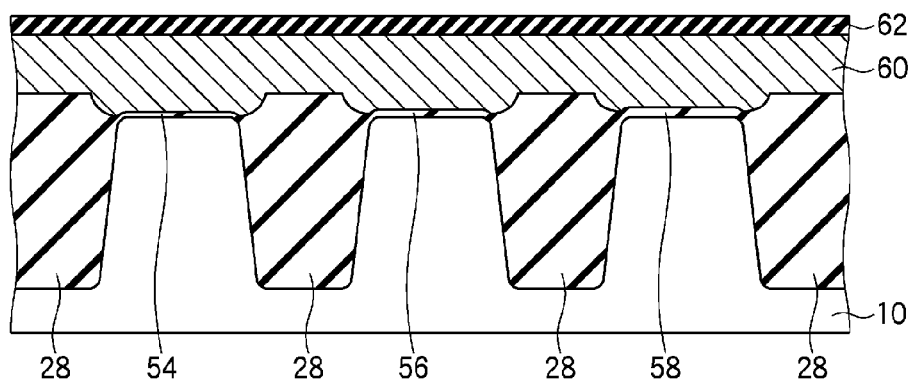
FIGS. 23A-23B are cross-sectional views each illustrating an operation of the method of manufacturing the semiconductor device according to the first embodiment (part 21)
Figure 23B:
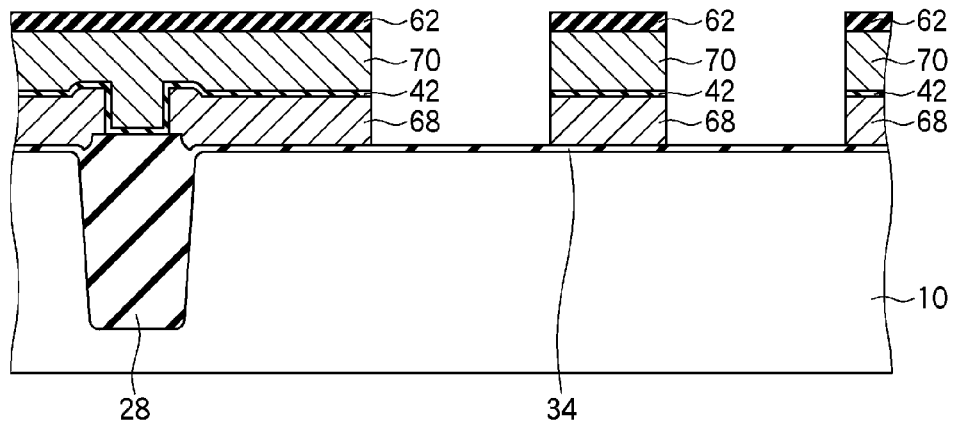

Next, by ashing and a subsequent post-treatment, the BARC film 64 and the photoresist film 66 remaining on the silicon nitride film 62 are removed (FIGS. 23A and 23B).

Subsequently, by a thermal oxidation method, side wall insulating films 72 composed of a silicon oxide film are formed on side wall portions of the floating gate 68 and the control gate 70.

Ion implantation is then performed using the control gate 70 as a mask, so that impurity diffusion regions 74 are formed in the silicon substrate 10 at two sides of the control gate 70.

Figure 24A:
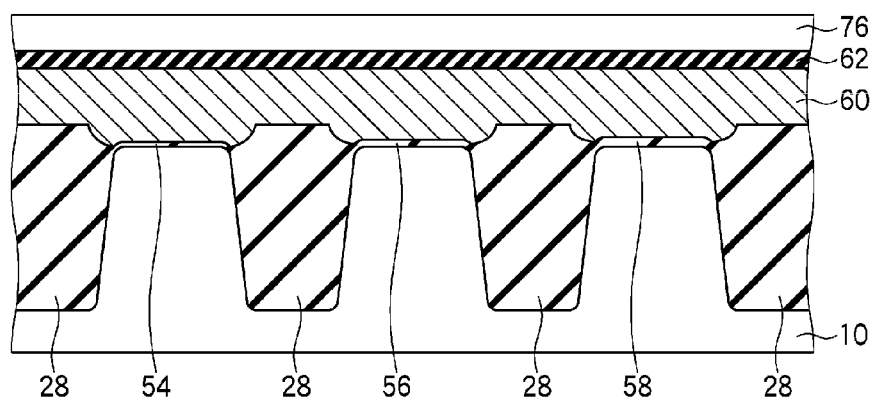
FIGS. 24A-24B are cross-sectional views each illustrating an operation of the method of manufacturing the semiconductor device according to the first embodiment (part 22)
Figure 24B:
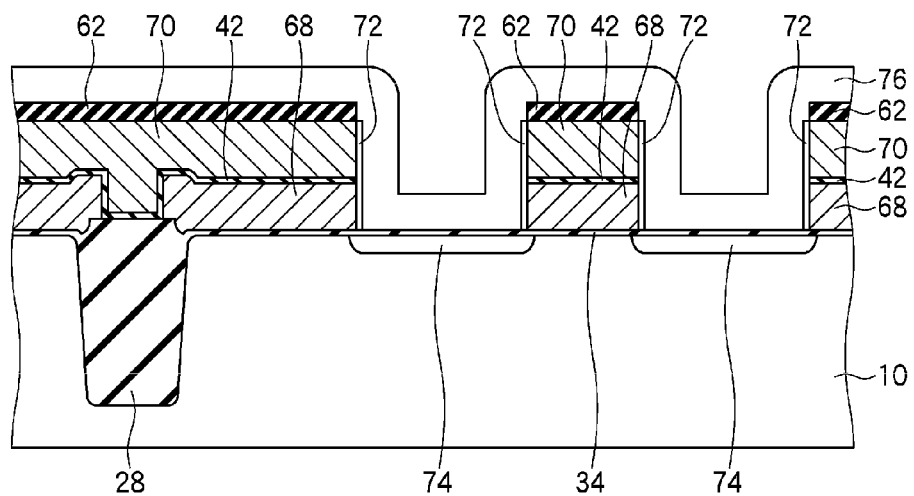

Next, a silicon nitride film 76 having a thickness of, for example, 30 nm to 150 nm is formed on the entire surface, for example, by a thermal CVD method (FIGS. 24A and 24B).

Figure 25A:
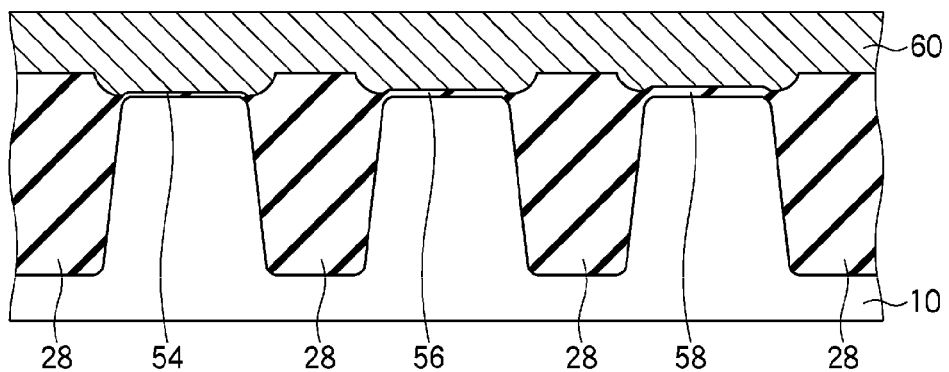
FIGS. 25A-25B are cross-sectional views each illustrating an operation of the method of manufacturing the semiconductor device according to the first embodiment (part 23)
Figure 25B:
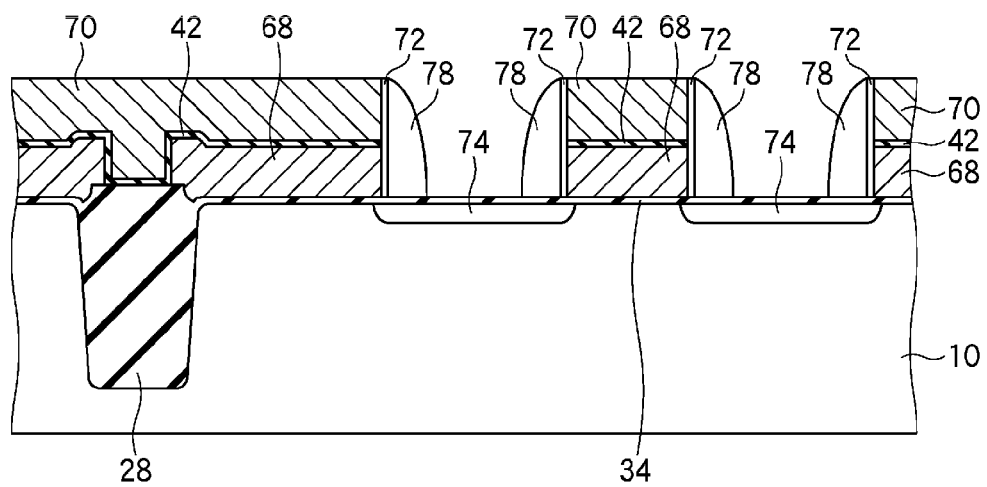

By performing dry etching, the silicon nitride films 76 and 62 are then anisotropically etched until the upper surfaces of the polysilicon film 60 and the control gate 70 are exposed, and side wall insulating films 78 are formed from the silicon nitride film 76 on the side wall portions of the floating gate 68 and the control gate 70 provided with the side wall insulating films 72 (FIGS. 25A and 25B).

Subsequently, a silicon oxide film 80 having a thickness of, for example, 15 nm to 40 nm is formed on the entire surface, for example, by a thermal CVD method. The silicon oxide film 80 is a film to be used as a hard mask when the polysilicon film 60 is patterned in a subsequent operation.

A BARC film 82 and a photoresist film 84 are then formed on the silicon oxide film 80 by a spin coating method.

Figure 26A:
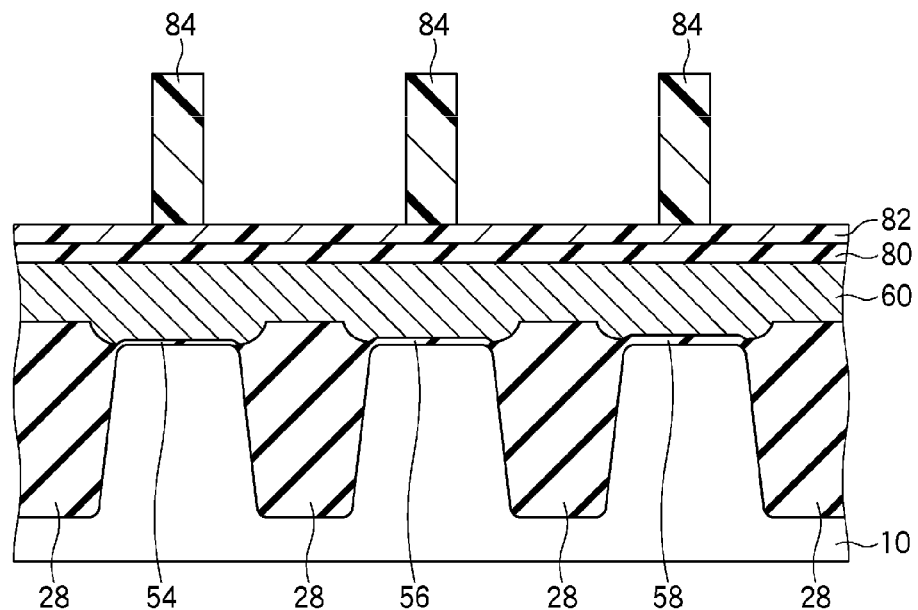
FIGS. 26A-26B are cross-sectional views each illustrating an operation of the method of manufacturing the semiconductor device according to the first embodiment (part 24)
Figure 26B:
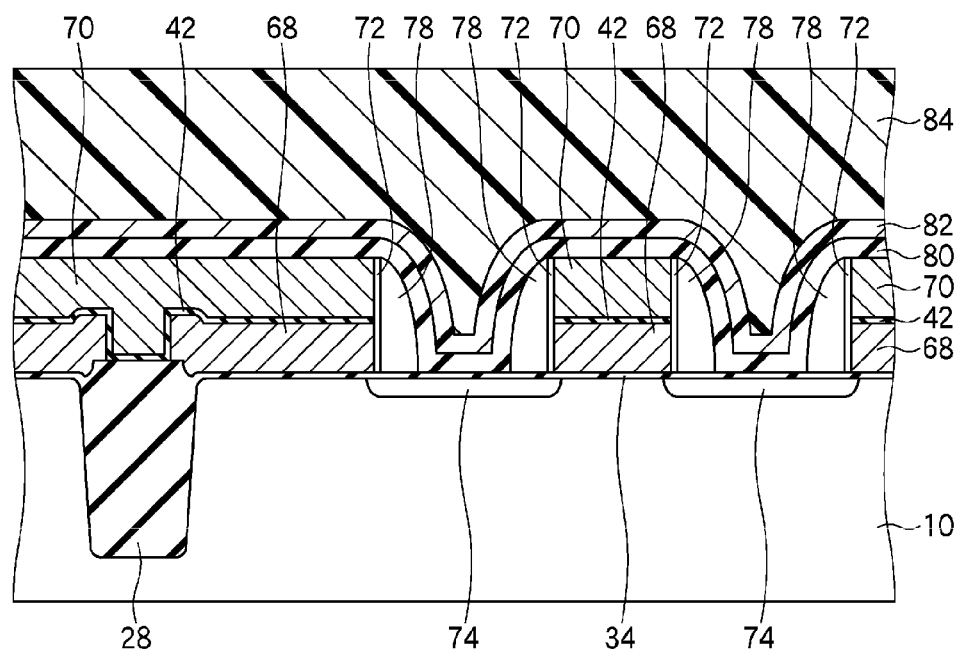

Next, the photoresist film 84 is patterned by photolithography so as to cover the memory cell region and the gate electrode forming regions of the peripheral transistors (low, medium, and high-voltage transistors) (FIGS. 26A and 26B).

Subsequently, by using the photoresist film 84 as a mask, for example, anisotropic etching is performed in an induc-tively coupled plasma etching apparatus, so that the BARC film 82, the silicon oxide film 80, and the polysilicon film 60 are patterned. As a result, the gate electrodes 86 composed of the polysilicon film 60 are formed in the peripheral circuit region.

By ashing and a subsequent post-treatment, the BARC film 82 and the photoresist film 84 remaining on the silicon oxide film 80 are then removed.

Next, for example, by wet etching using an aqueous hydrofluoric acid solution, the silicon oxide film 80 is removed.

Figure 27A:
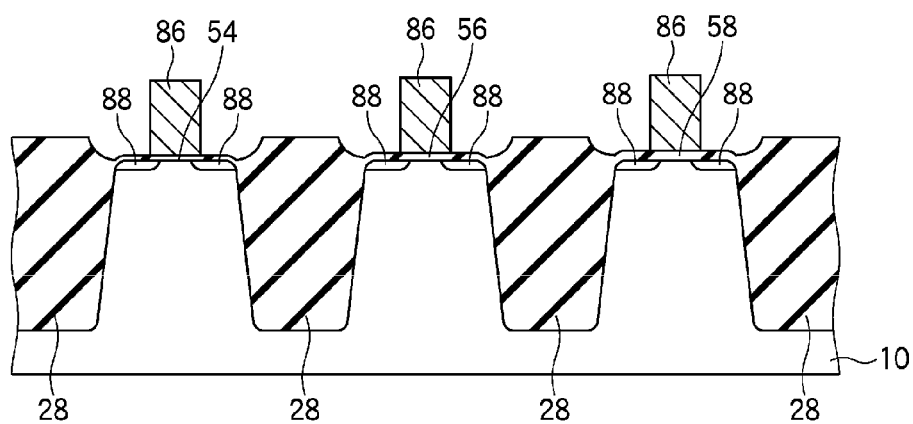
FIGS. 27A-27B are cross-sectional views each illustrating an operation of the method of manufacturing the semiconductor device according to the first embodiment (part 25)
Figure 27B:
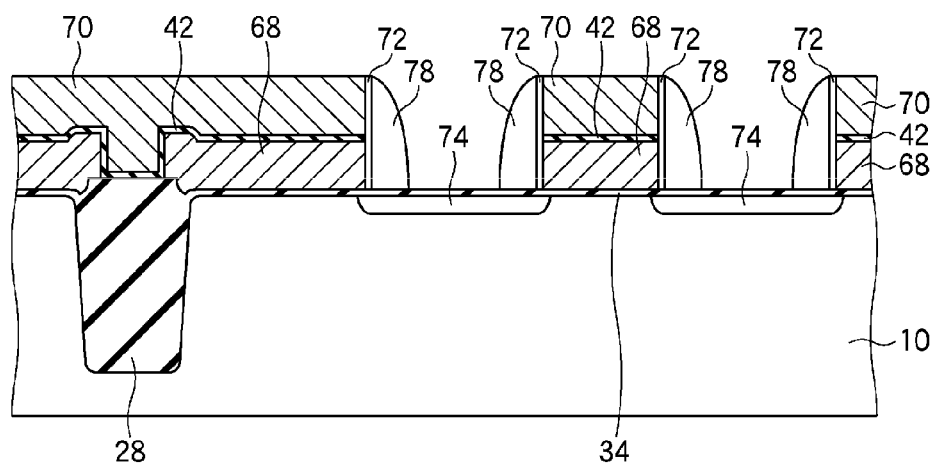

Subsequently, ion implantation is performed using the gate electrode 86 as a mask, impurity diffusion regions 88 are formed in the silicon substrate 10 at two sides of the gate electrode 86 (FIGS. 27A and 27B).

After a silicon nitride film is deposited, for example, by a thermal CVD method, this silicon nitride film is etched-back, so that side wall insulating films 90 composed of the silicon nitride film are formed on the side wall portions of the gate electrodes 86 and the side wall portions of the floating gate 68 and the control gate 70 on which the side wall insulating films 78 are provided.

Next, ion implantation is performed using the gate electrode 86 and the side wall insulating films 90 as a mask and also using the control gate 70 and the side wall insulating films 78 and 90 as a mask, so that impurity diffusion regions 92 are formed in the silicon substrate 10 at two sides of the gate electrode 86, and so that impurity diffusion regions 94 are formed in the silicon substrate 10 at two sides of the control gate 70.

Figure 28A:
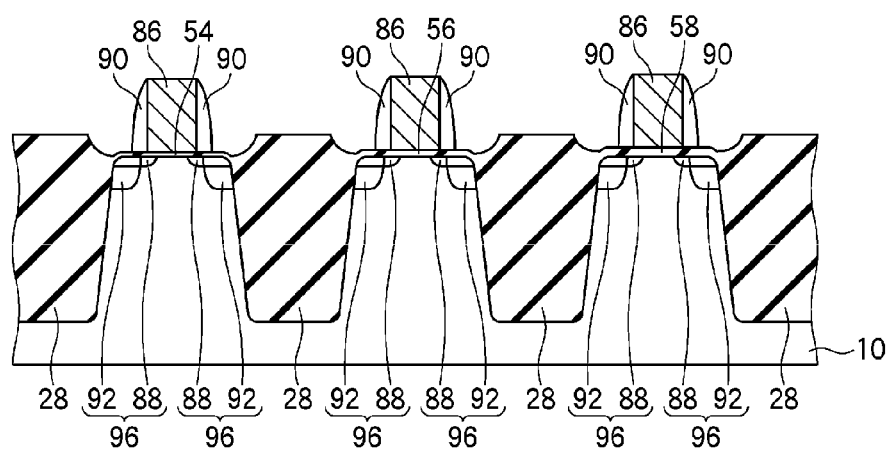
FIGS. 28A-28B are cross-sectional views each illustrating an operation of the method of manufacturing the semiconductor device according to the first embodiment (part 26)
Figure 28B:
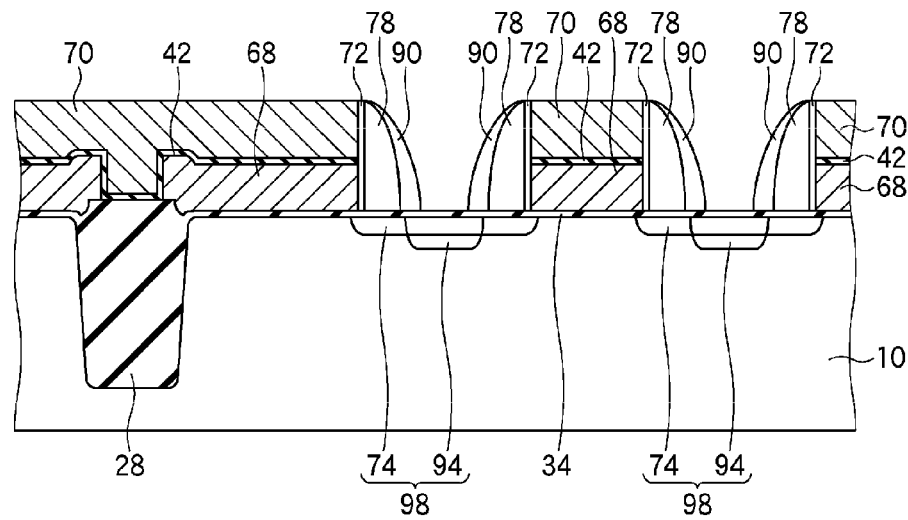

Subsequently, a thermal treatment is performed in a nitrogen atmosphere to activate implanted impurities, so that the source/drain regions 96 composed of the impurity diffusion regions 88 and 92 are formed in the silicon substrate 10 at two sides of the gate electrode 86, and so that the source/drain regions 98 composed of the impurity diffusion regions 74 and 94 are formed in the silicon substrate 10 at two sides of the control gate 70 (FIGS. 28A and 28B).

As a result, there are provided the non-volatile memory including the floating gate 68 formed in the memory cell region and on the silicon substrate 10 with the tunnel insulating film 34 interposed therebetween, the control gate 70 formed on the floating gate 68 with the ONO film 42 interposed therebetween, and the source/drain regions 98 formed in the silicon substrate 10 at the two sides of the control gate 70; the low-voltage transistor formed in the low-voltage transistor forming region and having the gate electrode 86 formed on the silicon substrate 10 with the gate insulating film 54 interposed therebetween and the source/drain regions 96 formed in the silicon substrate 10 at the two sides of the gate electrode 86; the medium-voltage transistor formed in the medium-voltage transistor forming region and having the gate electrode 86 formed on the silicon substrate 10 with the gate insulating film 56 interposed therebetween and the source/drain regions 96 formed in the silicon substrate 10 at the two sides of the gate electrode 86; and the high-voltage transistor formed in the high-voltage transistor forming region and having the gate electrode 86 formed on the silicon substrate 10 with the gate insulating film 58 interposed therebetween and the source/drain regions 96 formed in the silicon substrate 10 at the two sides of the gate electrode 86. The non-volatile memory may be formed on the silicon substrate 10, or the non-volatile memory may be formed over the silicon substrate 10.

Subsequently, after a salicide process and predetermined backend process, such as a multilayer wiring process, are performed, the semiconductor device is formed.

In the method of manufacturing a semiconductor device according to the above embodiment, the purpose and effect of the operation of removing a fluorocarbon film during a process of removing the ONO film 42 in the peripheral circuit region will be described with reference to FIGS. 29A to 31.

In the method of manufacturing a semiconductor device according to this embodiment, the reason the fluorocarbon film is removed during the process of removing the ONO film 42 in the peripheral circuit region is that the fluorocarbon film is responsible for degradation in withstand voltage of the gate insulating film of the high-voltage transistor.

As described above, during the operation of removing the ONO film 42 and the preceding operations, a recess 100 is formed at the boundary between the isolation film 28 and the active region (silicon substrate 10). During the dry etching process in which the top oxide film and the silicon nitride film, which is the intermediate layer, of the ONO film 42 are removed, a fluorocarbon film 102, which is a byproduct of the dry etching, is deposited on an inner wall of the recess 100. Since the fluorocarbon film 102 is liable to be deposited on a side wall portion of the recess 100, it is believed that the thickness of the fluorocarbon film 102 is small at a deep position of the recess 100 (see FIG. 29A).

When an operation of etching a bottom oxide film 104 is performed under this condition, since the etching rate thereof at a position to which the fluorocarbon film 102 adheres is low, the etching is preferentially advanced at the deep position of the recess 100 (see FIG. 29B).

When the etching of the bottom oxide film 104 (including the tunnel insulating film 34) is further advanced, the isolation film 28 is also etched at the deep position of the recess 100 at which the etching is already completed, and as a result, the shape of the recess 100 at the deep position becomes steep (FIG. 29C).

This steep shape of the recess 100 is maintained after the gate insulating film 58 is formed by subsequent thermal oxidation. As a result, it is believed that since the electric field concentration occurs when a gate insulating material is formed in the recess 100, the withstand voltage of the gate insulating film 58 of the high-voltage transistor is degraded.

In the gate insulating films 54 and 56 of the low-voltage transistor and the medium-voltage transistor, the degradation in withstand voltage as that observed in the gate insulating film 58 of the high-voltage transistor is not observed. The reason for this is believed that in the low-voltage transistor forming region and the medium-voltage transistor forming region, since the gate insulating films 54 and 56 are formed by re-oxidation after the silicon oxide film 46 is removed, the shape of the recess 100 is smoothed, and the electric field concentration is not likely to occur.

By the operation of removing a fluorocarbon film performed as in this embodiment, the etching of the bottom oxide film is prevented from being locally advanced, and hence a steep recess is prevented from being formed at the deep portion of the recess after the bottom oxide film is removed.

FIGS. 30A and 30B are TEM images of cross-sectional views of end portions of the isolation films of samples, one of which was processed by an operation of removing a fluorocarbon film and the other one was not. FIG. 30A is a cross-sectional TEM image of the sample which was not processed by the operation of removing a fluorocarbon film, and FIG. 30B is a cross-sectional TEM image of the sample which was processed by the operation of removing a fluorocarbon film.

As illustrated in the figures, according to the sample which was processed by the operation of removing a fluorocarbon film, the deep portion (enclosed by a dotted line in the figure) of the recess has a smooth shape as compared to that of the sample which was not processed by the operation of removing a fluorocarbon film.

FIG. 31 is a graph illustrating the accumulative probability distribution of the withstand voltage of the gate insulating film when a reverse bias (negative voltage with respect to the silicon substrate) is applied to the gate electrode of the high-voltage transistor. In this graph, ○ indicates a sample which was not processed by the operation of removing a fluorocarbon film (Comparative Example), ◆ indicates a sample which was processed by the operation of removing a fluorocarbon film according to the above first method (Example 1), and ◆ indicates a sample which was processed by the operation of removing a fluorocarbon film according to the above second method (Example 2).

As illustrated in the figure, the samples which were not processed by the operation of removing a fluorocarbon film had a large variation in withstand voltage of the gate insulating film; however, on the other hand, according to the samples which were processed by the operation of removing a fluorocarbon film according to either the first method or the second method, stable and high withstand voltage of the gate insulating film could be obtained.

As described above, according to this embodiment, when the ONO film in the peripheral circuit region is removed, the operation of removing a fluorocarbon film as the residual film adhering to the surface is performed after the top insulating film and the intermediate layer are removed; hence, the shape of the recess formed at the end portion of the isolation film is prevented from being changed during the subsequent process of removing the bottom insulating film. Accordingly, the electric field concentration on the end portion of the isolation film may be prevented, and as a result, the degradation in withstand voltage of the gate insulating film of the peripheral transistor may be prevented.

A method of manufacturing a semiconductor device according to the second embodiment will be described with reference to FIGS. 32A to 36B. Constituent elements similar to those of the semiconductor device and the manufacturing method in the first embodiment illustrated in FIGS. 1A to 28B are designated by the same reference numerals as described above, and a description thereof will be omitted or simplified.

Figure 32A:
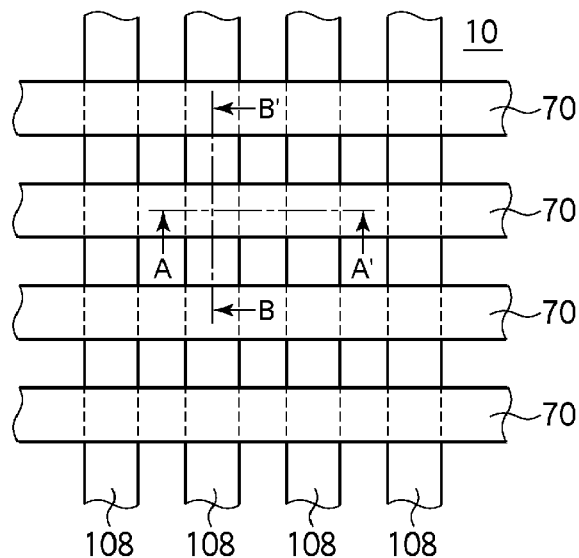
FIG. 32A is a plan view illustrating the structure of a semiconductor device according to a second embodiment.
Figure 32B:
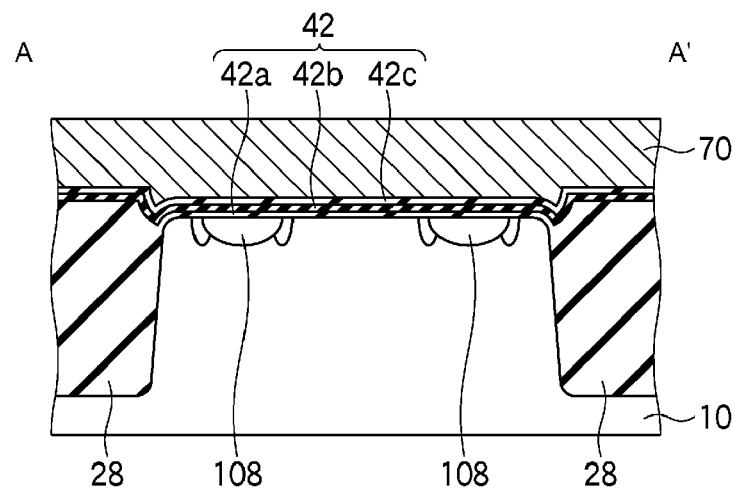
FIGS. 32B-32C are cross-sectional views each illustrating the structure of the semiconductor device according to the second embodiment.
Figure 32C:
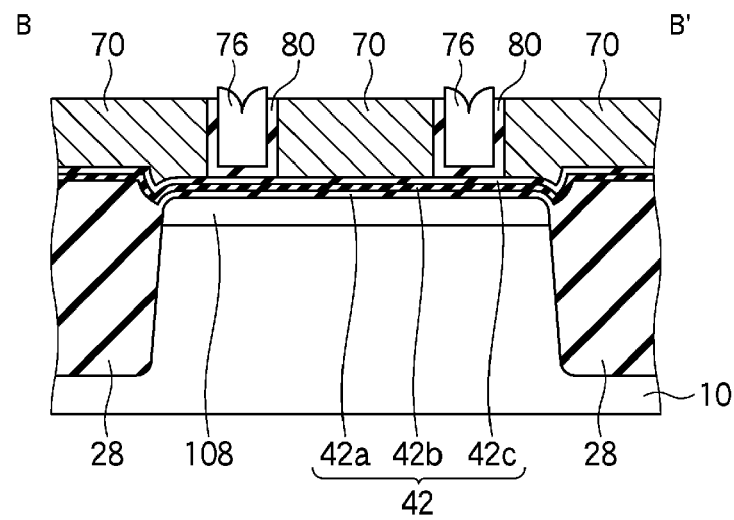

FIG. 32A is a plan view and FIGS. 32B and 32C are cross-sectional views, each of which illustrates the structure of a semiconductor device according to this embodiment, and FIGS. 33A to 36B are cross-sectional views each illustrating an operation of the method of manufacturing a semiconductor device according to this embodiment.

First, the structure of the semiconductor device according to this embodiment will be described with reference to FIGS. 32A to 32C. FIG. 32A is a plan view illustrating the semiconductor device according to this embodiment; FIG. 32B is a schematic cross-sectional view taken along the line A-A' of FIG. 32A; and FIG. 32C is a schematic cross-sectional view taken along the line B-B' of FIG. 32A.

The semiconductor device according to this embodiment is a semiconductor device including a transistor and a non-volatile memory each having a single layer gate structure in which an ONO film is used as a charge storage layer. As with the semiconductor device according to the first embodiment, the semiconductor device of this embodiment also has a memory cell region in which non-volatile memories (Flash) are formed in a matrix and a peripheral circuit region in which various peripheral transistors, such as a logic transistor forming a logic circuit and a high-voltage transistor driving a non-volatile memory, are formed. As the peripheral transistors, the semiconductor device of this embodiment includes, for example, a low-voltage transistor (LV-Tr) forming a high speed logic circuit, a medium-voltage transistor (MV-Tr) forming an input/output circuit, and a high-voltage transistor (HV-Tr) controlling a non-volatile memory.

As illustrated in FIG. 32A, in a silicon substrate 10 in the memory cell region, a plurality of bit lines 108 composed of impurity diffusion layers are formed in a stripe matrix. On the silicon substrate 10 in which the bit lines 108 are formed, a plurality of control gates 70 extended in a direction intersecting the bit lines 108 are formed in a stripe matrix. Between the silicon substrate 10 and the control gate 70, a charge storage layer composed of an ONO film 42 (silicon oxide film 42c/silicon nitride film 42b/silicon oxide film 42a) is formed (see FIGS. 32B and 32C). The bit lines 108 and the control gates 70 may be formed on the silicon substrate 10, or the lines 108 and the control gates 70 may be formed over the silicon substrate 10. The control gates 70 may be formed on the silicon substrate 10, or the control gates 70 may be formed over the silicon substrate 10. The ONO film 42 may be formed on the silicon substrate 10, or the ONO film 42 may be formed over the silicon substrate 10.

Accordingly, at each intersection between the control gate 70 and a region between adjacent bit lines 108, a non-volatile memory is formed which has the control gate 70, source/drain regions formed from adjacent bit lines 108, and the ONO film 42 used as a charge storage layer. In the region between the control gates 70, a silicon nitride film 76 and a liner film formed of a silicon oxide film 80 are filled as illustrated in FIG. 32C. In addition, in FIGS. 32B and 32C, although isolation films 28 are illustrated at two sides for convenient illustration, the isolation film 28 is actually formed so as to surround the periphery of the memory cell region.

The low-voltage transistor (LV-Tr), the medium-voltage transistor (MV-Tr), and the high-voltage transistor (HV-Tr) formed in the peripheral circuit region are similar to those of the semiconductor device according to the first embodiment, and hence a description thereof is omitted.

Next, the method of manufacturing a semiconductor device according to this embodiment will be described with reference to FIGS. 33A to 36B. FIGS. 33A to 34C are cross-sectional views each illustrating a manufacturing operation taken along the line A-A' of FIG. 32A, and FIGS. 35A to 36B are cross-sectional views each illustrating a manufacturing operation taken along the line B-B' of FIG. 32A.

In addition, since a manufacturing process of the peripheral transistors is basically equivalent to that of the manufacturing method of the semiconductor device according to the first embodiment, a manufacturing process of the non-volatile memory will be primarily described in this embodiment. The manufacturing process of the peripheral transistors will be described with reference to the figures of the first embodiment whenever necessary.

First, as with the method of manufacturing a semiconductor device according to the first embodiment illustrated in FIGS. 3A to 10B, the isolation film 28 defining the active region is formed by a shallow trench isolation (STI) method.

Figure 33A:
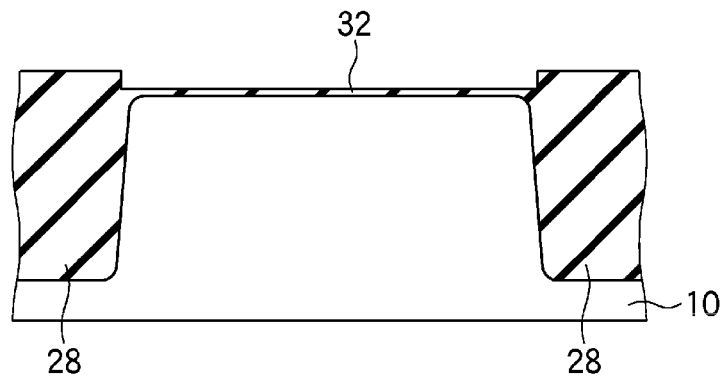
FIGS. 33A-33C are cross-sectional views each illustrating an operation of a method of manufacturing the semiconductor device according to the second embodiment (part 1)

A sacrifice oxide film 32 composed of a silicon oxide film is then formed, for example, by a thermal oxidation method on the active region of the silicon substrate 10 defined by the isolation film 28 (FIG. 33A).

Subsequently, predetermined wells (not illustrated) are formed in the memory cell region and the high-voltage transistor forming region by photolithography and ion implantation. For example, double wells in which a p-type well is formed in an n-type well are formed in the memory cell region and an n-type high-voltage transistor forming region, and an n-type well is formed in a p-type high-voltage transistor forming region.

Next, for example, a heat treatment is then performed in a nitrogen atmosphere at a temperature of 900° C. to 1,200° C. for 1 second to 15 seconds, so that implanted impurities are activated.

Next, for example, wet etching is performed using an aqueous hydrofluoric acid solution diluted with pure water at a ratio of approximately 10:1 to 200:1, so that the sacrifice oxide film 32 is removed.

Incidentally, the thickness of the isolation film 28 is gradually decreased, for example, by the operations of removing a silicon oxide film 12 and the sacrifice oxide film 32. Accordingly, after the sacrifice oxide film 32 is removed, a recess which is recessed from the surface of the active region is formed at the boundary between the isolation film 28 and the active region.

Next, the silicon oxide film 42a having a thickness of, for example, 5 nm to 14 nm is formed on the surface of the silicon substrate 10 by a thermal oxidation method. The silicon oxide film 42a may be formed on the silicon substrate 10, or the silicon oxide film 42a may be formed over the silicon substrate 10.

Figure 33B:
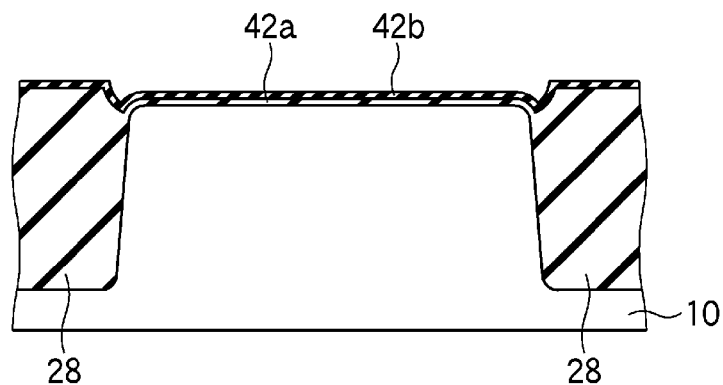

Subsequently, the silicon nitride film 42b having a thickness of, for example, 5 nm to 14 nm is formed on the entire surface of the silicon oxide film 42a, for example, by a thermal CVD method (FIG. 33B). The silicon nitride film 42b may be formed on the silicon nitride film 42b, or the silicon nitride film 42b may be formed over the silicon nitride film 42b.

Figure 33C:
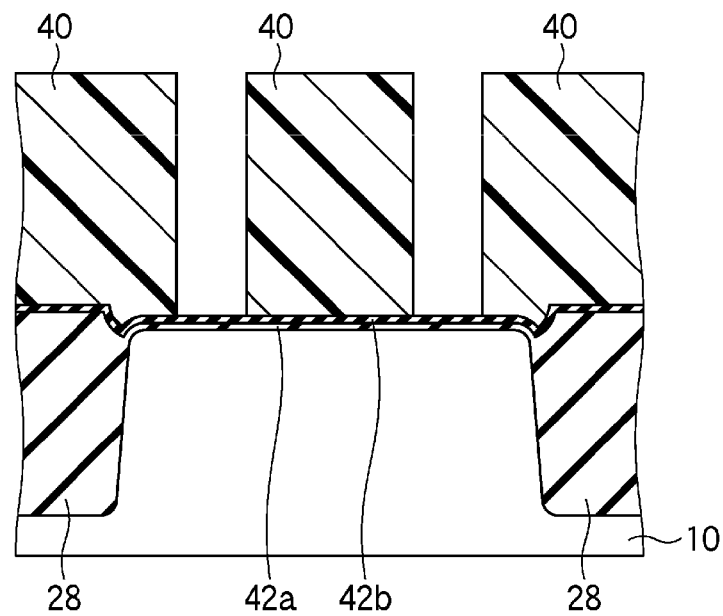

A photoresist film 40 is formed on the silicon nitride film 42b by photolithography so as to cover the entire surface of the peripheral circuit region and so as to expose bit line forming regions of the memory cell region (FIG. 33C).

Figure 34A:
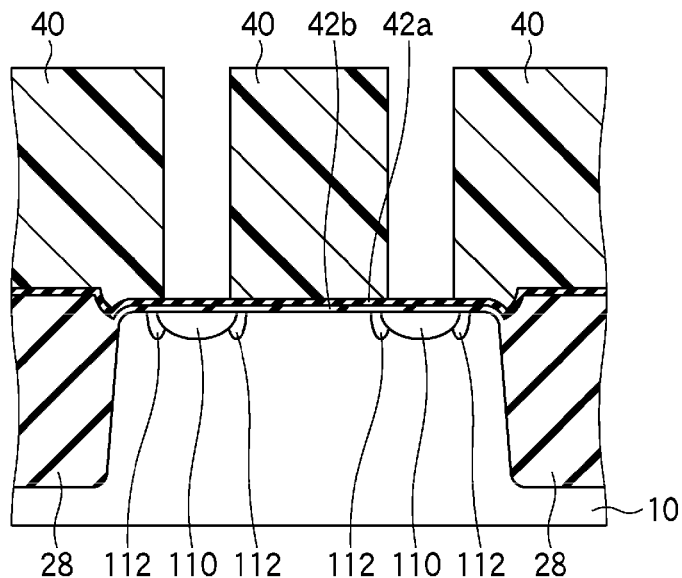
FIGS. 34A-34C are cross-sectional views each illustrating an operation of the method of manufacturing the semiconductor device according to the second embodiment (part 2)

Next, by ion implantation using the photoresist film 40 as a mask, impurity diffusion regions 110 used as the bit lines 108 and impurity diffusion regions 112 used as pocket regions provided at two ends of the impurity diffusion region 110 are formed in the memory cell region (FIG. 34A).

By ashing and a subsequent post-treatment, the photoresist film 40 on the silicon nitride film 42b is then removed.

Subsequently, the silicon oxide film 42c is formed on the silicon nitride film 42b. The silicon oxide film 42c is formed, for example, by the operations of thermally oxidizing the silicon nitride film 42b by a thermal oxidation method, and then forming a high temperature oxide (HTO) film by a thermal CVD method.

Figure 34B:
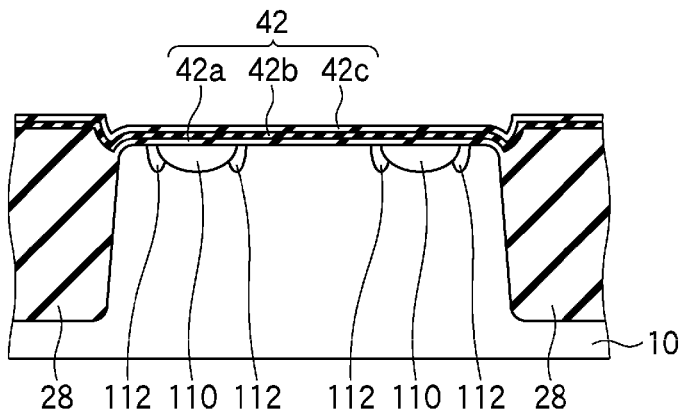

The laminate film composed of the silicon oxide film 42a/silicon nitride film 42b/silicon oxide film 42c is formed as described above, so that the charge storage layer is formed from the ONO film 42 (FIG. 34B). The ONO film 42 thus formed is also formed in the peripheral circuit region as with the case of the first embodiment (see FIG. 15A).

By photolithography and ion implantation, predetermined wells (not illustrated) are then formed in the low-voltage transistor forming region and the medium-voltage transistor forming region. For example, p-type wells are formed in an n-type low-voltage transistor forming region and an n-type medium-voltage transistor forming region, and n-type wells are formed in a p-type low-voltage transistor forming region and a p-type medium-voltage transistor forming region.

Subsequently, as with the method of manufacturing a semiconductor device according to the first embodiment illustrated in FIGS. 15A to 16A, the ONO film 42 in the peripheral circuit region is removed. In this embodiment, the ONO film 42 is also formed in the recess formed at the boundary between the isolation film 28 and the active region. Accordingly, after the silicon oxide film 42c and the silicon nitride film 42b are removed, an operation of removing a fluorocarbon film as a residual film similar to that in the first embodiment is performed, so that the degradation in withstand voltage of the high-voltage transistor is prevented.

In particular, after a photoresist film 44 exposing the peripheral circuit region and covering the memory cell region is formed, by using this photoresist film 44 as a mask, the silicon oxide film 42c and the silicon nitride film 42b are etched, for example, by dry etching performed in a magnetron reactive ion etching apparatus. Next, a fluorocarbon film which adheres to the surface of the substrate when the silicon oxide film 42c and the silicon nitride film 42b are etched is removed by the first or the second method described in the first embodiment. Next, by using the photoresist film 44 as a mask, for example, wet etching is performed by an aqueous hydrofluoric acid solution diluted with pure water at a ratio of approximately 100:1 to 200:1, so that the silicon oxide film 42a is removed. By ashing and a subsequent post-treatment, the photoresist film 44 is then removed.

By removing the ONO film 42 as described above, the shape of the recess formed at the boundary between the isolation film 28 and the active region is prevented from being changed.

Figure 21A:
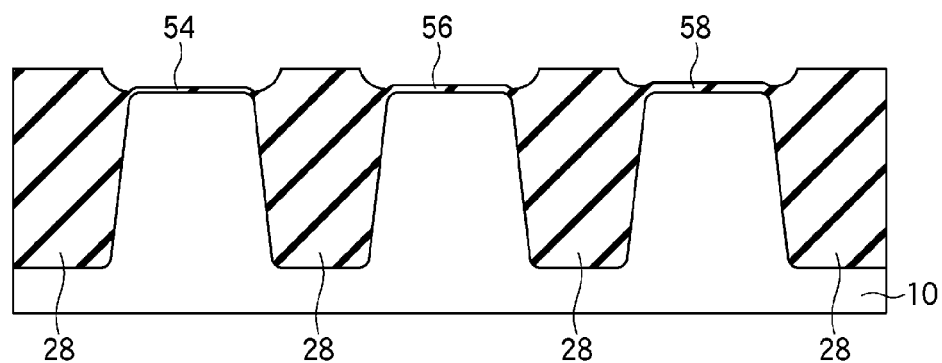
FIGS. 21A-21B are cross-sectional views each illustrating an operation of the method of manufacturing the semiconductor device according to the first embodiment (part 19)
Figure 21B:
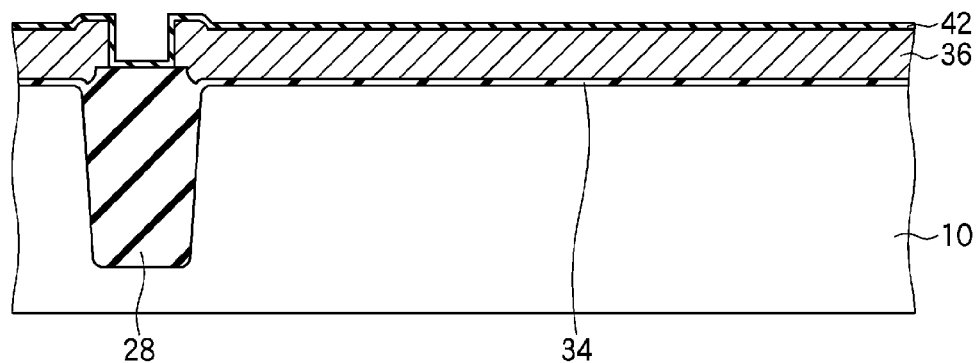

Subsequently, as with the method of manufacturing a semiconductor device according to the first embodiment illustrated in FIGS. 17A and 21A, three types of gate insulating films 54, 56, and 58 having different thicknesses from each other are formed in the low-voltage transistor forming region, the medium-voltage transistor forming region, and the high-voltage transistor forming region (see FIG. 21A), respectively.

A polysilicon film 60 having a thickness of, for example, 50 nm to 200 nm is then formed on the entire surface of the silicon substrate 10, for example, by a CVD method. The polysilicon film 60 is formed into the control gate 70 of the non-volatile memory and gate electrodes 86 of the peripheral transistors. The polysilicon film 60 may be formed on the silicon substrate 10, or the polysilicon film 60 may be formed over the silicon substrate 10.

Figure 34C:
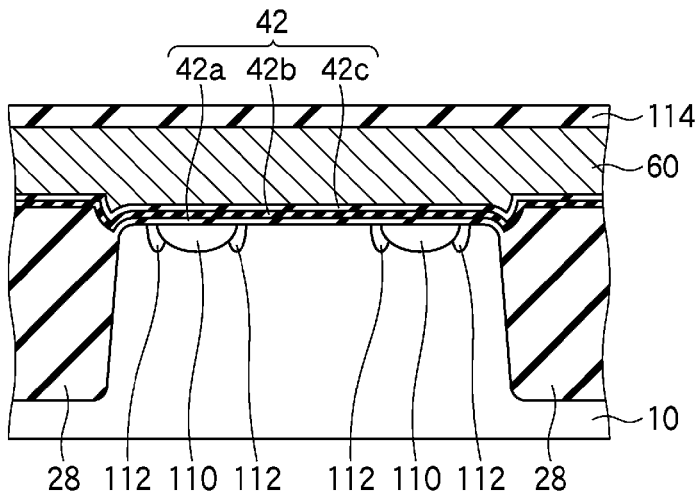

Next, a silicon oxide film 114 having a thickness of, for example, 15 nm to 40 nm is formed on the polysilicon film 60, for example, by a CVD method (FIG. 34C). The silicon oxide film 114 may be formed on the polysilicon film 60, or the silicon oxide film 114 may be formed over the polysilicon film 60.

A BARC film 64 and a photoresist film 66 are then formed on the silicon oxide film 114 by a spin coating method.

Figure 35A:
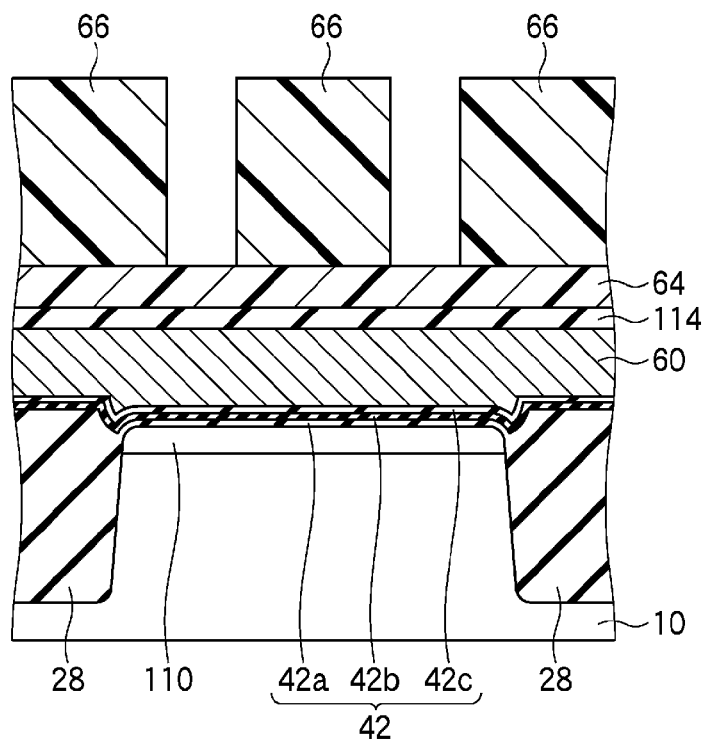
FIGS. 35A-35B are cross-sectional views each illustrating an operation of the method of manufacturing the semiconductor device according to the second embodiment (part 3)

Subsequently, the photoresist film 66 is patterned by photolithography so as to cover the entire surface of the peripheral circuit region and the control gate forming region of the memory cell region (FIG. 35A).

Next, by using the photoresist films 66 as a mask, the BARC film 64, the silicon oxide film 114, and the polysilicon film 60 are patterned, for example, by anisotropic etching performed in an inductively coupled plasma etching apparatus, so that the control gate 70 is formed from the polysilicon film 60 in the memory cell region.

Figure 35B:
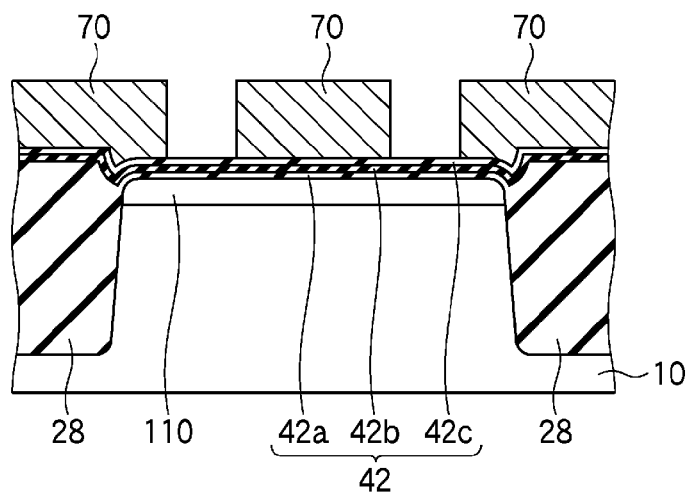

Next, by ashing and a subsequent post-treatment, the silicon oxide film 114, the BARC film 64, and the photoresist film 66 remaining on the polysilicon film 60 are removed (FIG. 35B). The peripheral circuit region is still entirely covered with the polysilicon film 60 (see FIG. 25A).

Figure 36A:
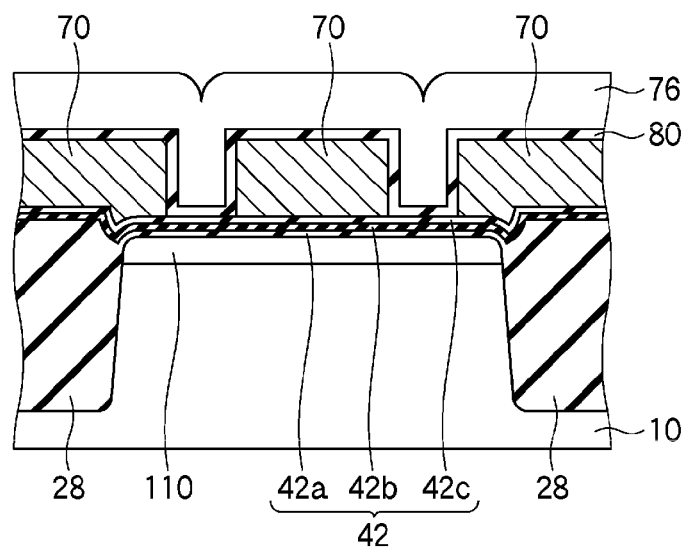
FIGS. 36A-36B are cross-sectional views each illustrating an operation of the method of manufacturing the semiconductor device according to the second embodiment (part 4)

The silicon oxide film 80 having a thickness of, for example, 1 nm to 20 nm and the silicon nitride film 76 having a thickness of, for example, 50 nm to 170 nm are then formed on the entire surface of the silicon substrate 10, for example, by a thermal CVD method (FIG. 36A). The silicon oxide film 80 and the silicon nitride film 76 may be formed on the entire surface of the silicon substrate 10, or the silicon oxide film 80 and the silicon nitride film 76 may be formed over the entire surface of the silicon substrate 10.

Figure 36B:
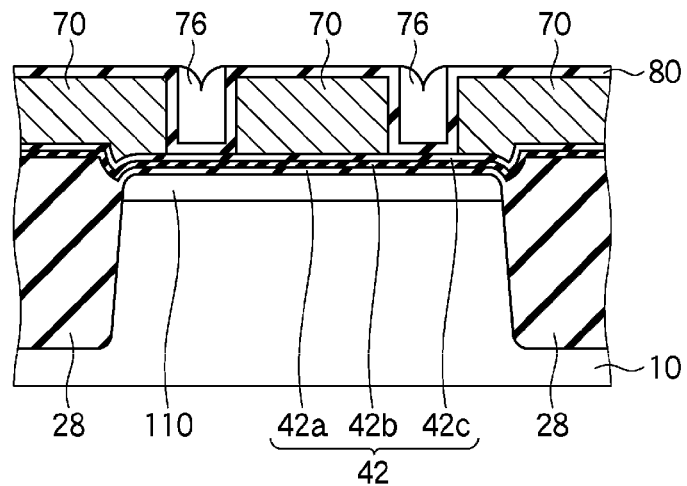

Subsequently, the silicon nitride film 76 is anisotropically etched by dry etching until the upper surface of the silicon oxide film 80 is exposed, so that the space between the control gates 70 is filled with the silicon oxide film 80 and the silicon nitride film 76 (FIG. 36B). As a result, the non-volatile memory of this embodiment is formed.

As with the method of manufacturing a semiconductor device according to the first embodiment illustrated in FIGS. 26A to 28B, after the gate electrodes 86 are formed by patterning the polysilicon film 60 in the peripheral circuit region, source/drain regions 96 are then formed, so that the low-voltage transistor, the medium-voltage transistor, and the high-voltage transistor are formed.

Next, a salicide process and predetermined backend processes, such as a multilayer wiring process, are performed, so that the semiconductor device is formed.

As described above, according to this embodiment, when the ONO film in the peripheral circuit region is removed, after the top insulating film and the intermediate layer are removed, the operation of removing a fluorocarbon film as a residual film adhering to the surface is performed; hence, during a subsequent process of removing the bottom insulating film, the shape of the recess formed at the end portion of the isolation film is prevented from being changed. Accordingly, the electric field concentration on the end portion of the isolation film is prevented, and hence the degradation in withstand voltage of the gate insulating film of the peripheral transistor may be prevented.

A method of manufacturing a semiconductor device according to the third embodiment will be described with reference to FIGS. 37A to 40B. Constituent elements similar to those of the semiconductor device and the manufacturing method in the first embodiment illustrated in FIGS. 1 to 28B and the second embodiment illustrated in FIGS. 32A to 36B are designated by the same reference numerals as described above, and a description thereof will be omitted or simplified.

Figure 37A:
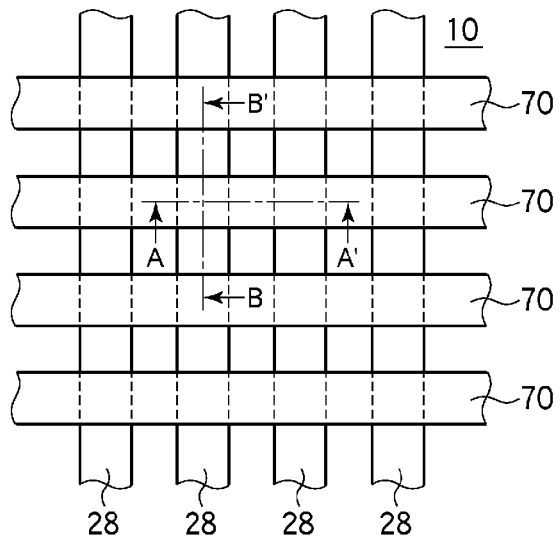
FIG. 37A is a plan view illustrating the structure of a semiconductor device according to a third embodiment.
Figure 37B:
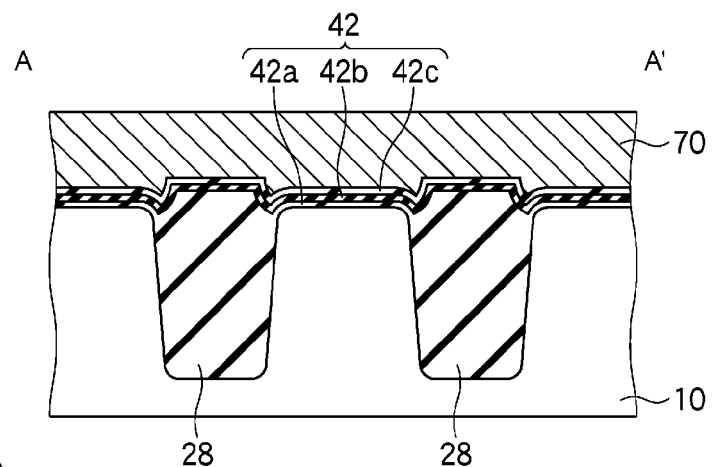
FIGS. 37B-37C are cross-sectional views each illustrating the structure of the semiconductor device according to the third embodiment.
Figure 37C:
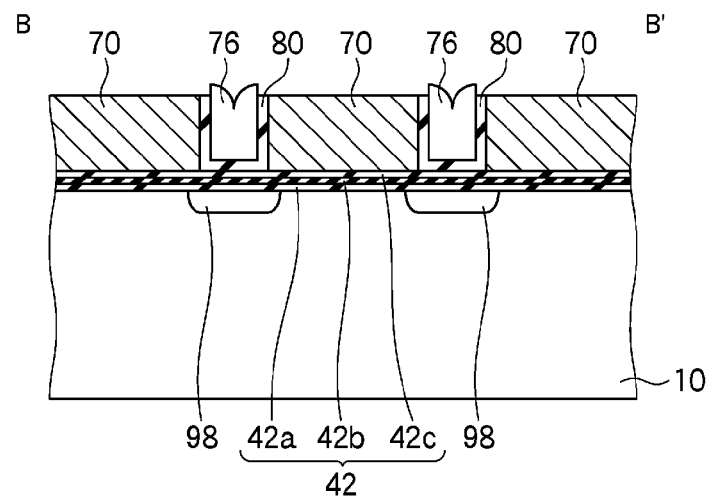

FIG. 37A is a plan view and FIGS. 37B and 37C are cross-sectional views, each of which illustrates the structure of a semiconductor device according to this embodiment, and FIGS. 38A to 40B are cross-sectional views each illustrating an operation of the method of manufacturing a semiconductor device according to this embodiment.

The structure of the semiconductor device according to this embodiment will be described with reference to FIGS. 37A to 37C. FIG. 37A is a plan view illustrating the semiconductor device according to this embodiment; FIG. 37B is a schematic cross-sectional view taken along the line A-A' of FIG. 37A; and FIG. 37C is a schematic cross-sectional view taken along the line B-B' of FIG. 37A.

The semiconductor device according to this embodiment is a semiconductor device including a transistor and a non-volatile memory having a single layer gate structure in which an ONO film is used as a charge storage layer. As with the semiconductor device according to the first embodiment, the semiconductor device of this embodiment also has a memory cell region in which non-volatile memories (Flash) are formed in a matrix and a peripheral circuit region in which various peripheral transistors, such as a logic transistor forming a logic circuit and a high-voltage transistor driving a non-volatile memory, are formed. As the peripheral transistors, the semiconductor device of this embodiment includes, for example, a low-voltage transistor (LV-Tr) forming a high speed logic circuit, a medium-voltage transistor (MV-Tr) forming an input/output circuit, and a high-voltage transistor (HV-Tr) controlling a non-volatile memory.

As illustrated in FIG. 37A, in a silicon substrate 10 in the memory cell region, a plurality of isolation films 28 are formed in a stripe matrix. On the silicon substrate 10 in which the isolation films 28 are formed, a plurality of control gates 70 extended in a direction intersecting the isolation films 28 are formed in a stripe matrix. Between the silicon substrate 10 and the control gate 70, a charge storage layer composed of an ONO film 42 (silicon oxide film 42c/silicon nitride film 42b/silicon oxide film 42a) is formed. In regions of the silicon substrate 10 between the control gates 70, source/drain regions 98 are formed (see FIGS. 37B and 37C). The control gate 70 may be formed on the silicon substrate 10, or the control gate 70 may be formed over the silicon substrate 10.

Accordingly, at each intersection between the control gate 70 and a region between adjacent isolation films 28, a non-volatile memory is formed in which the control gate 70, the source/drain regions 98 formed in the silicon substrate 10 and at two sides of the control gate 70, and the ONO film 42 used as a charge storage layer are provided. In the region between the control gates 70, as illustrated in FIG. 37C, a silicon nitride film 76 and a liner film formed of a silicon oxide film 80 are filled.

The low-voltage transistor (LV-Tr), the medium-voltage transistor (MV-Tr), and the high-voltage transistor (HV-Tr) formed in the peripheral circuit region are similar to those of the semiconductor device of the first embodiment, and hence a description thereof is omitted.

Figure 38A:
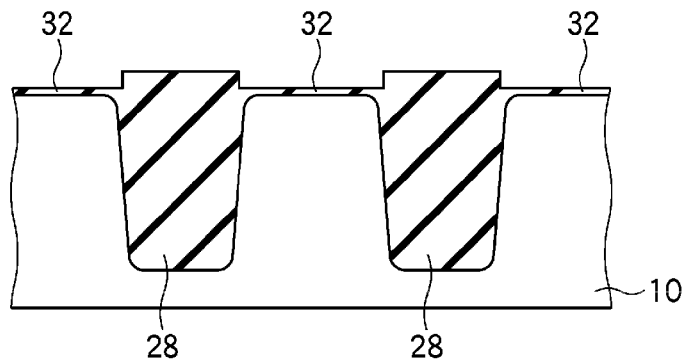
FIGS. 38A-38C are cross-sectional views each illustrating an operation of a method of manufacturing the semiconductor device according to the third embodiment (part 1)
Figure 38B:
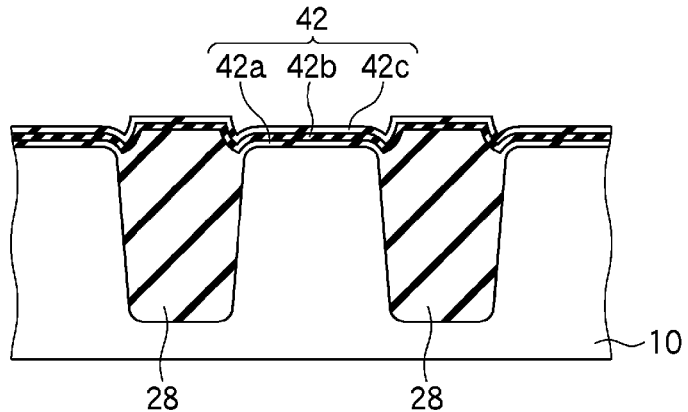
Figure 38C:
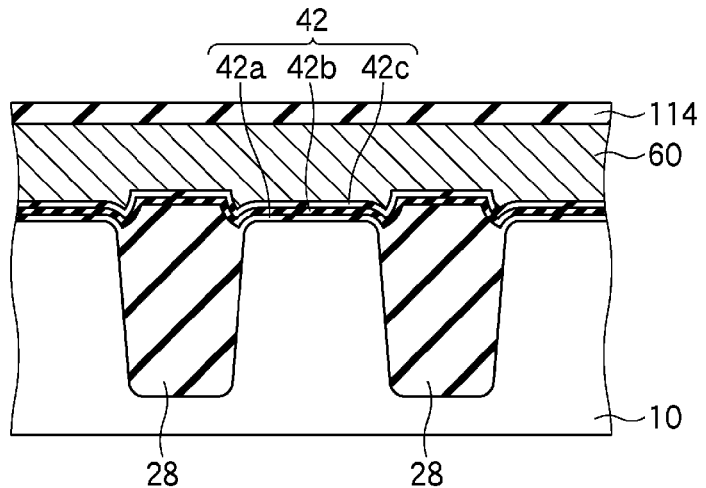

Next, the method of manufacturing a semiconductor device according to this embodiment will be described with reference to FIGS. 38A to 40B. FIGS. 38A to 38C are cross-sectional views each illustrating a manufacturing operation taken along the line A-A' of FIG. 37A, and FIGS. 39A to 40B are cross-sectional views each illustrating a manufacturing operation taken along the line B-B' of FIG. 37A.

In addition, since a manufacturing process of the peripheral transistors is basically equivalent to that of the manufacturing method of the semiconductor device according to the first embodiment, a manufacturing process of the non-volatile memory will be primarily described in this embodiment. The manufacturing process of the peripheral transistors will be described with reference to the figures of the first embodiment whenever necessary.

First, as with the method of manufacturing a semiconductor device according to the first embodiment illustrated in FIGS. 3A to 10B, the isolation film 28 defining the active region is formed by a STI method.

A sacrifice oxide film 32 composed of a silicon oxide film is then formed on the active region of the silicon substrate 10 defined by the isolation film 28, for example, by a thermal oxidation method (FIG. 38A).

Subsequently, predetermined wells (not illustrated) are formed in the memory cell region and the high-voltage transistor forming region by photolithography and ion implantation. For example, double wells in each of which a p-type well is formed in an n-type well are formed in the memory cell region and an n-type high-voltage transistor forming region, and an n-type well is formed in a p-type high-voltage transistor forming region.

Next, for example, a heat treatment is performed in a nitrogen atmosphere at a temperature of 900° C. to 1,200° C. for 1 second to 15 seconds, so that implanted impurities are activated.

Next, for example, wet etching is performed using an aqueous hydrofluoric acid solution diluted with pure water at a ratio of approximately 10:1 to 200:1, so that the sacrifice oxide films 32 are removed.

Incidentally, the thickness of the isolation film 28 is gradually decreased, for example, by the operations of removing a silicon oxide film 12 and the sacrifice oxide film 32. Accordingly, after the sacrifice oxide film 32 is removed, a recess which is recessed from the surface of the active region is formed at the boundary between the isolation film 28 and the active region.

Next, the silicon oxide film 42a having a thickness of, for example, 5 nm to 14 nm is formed on the surface of the silicon substrate 10 by a thermal oxidation method. The silicon oxide film 42a may be formed on the silicon substrate 10, or the silicon oxide film 42a may be formed over the silicon substrate 10.

Subsequently, the silicon nitride film 42b having a thickness of, for example, 5 nm to 14 nm is formed on the entire surface of the silicon oxide film 42a, for example, by a thermal CVD method (FIG. 33B). The silicon nitride film 42b may be formed on the silicon oxide film 42a, or the silicon nitride film 42b may be formed over the silicon oxide film 42a.

Next, the silicon oxide film 42c having a thickness of, for example, 3 nm to 15 nm is formed on the silicon nitride film 42b, for example, by a thermal oxidation method. The silicon oxide film 42c may be formed on the silicon nitride film 42b, or the silicon oxide film 42c may be formed over the silicon nitride film 42b.

The laminate film composed of the silicon oxide film 42a/silicon nitride film 42b/silicon oxide film 42c is formed as described above, so that the charge storage layer is formed from the ONO film 42 (FIG. 38B). The ONO film 42 thus formed is also formed in the peripheral circuit region as in the case of the first embodiment (see FIG. 15A).

By photolithography and ion implantation, predetermined wells (not illustrated) are then formed in the low-voltage transistor forming region and the medium-voltage transistor forming region. For example, p-type wells are formed in an n-type low-voltage transistor forming region and an n-type medium-voltage transistor forming region, and n-type wells are formed in a p-type low-voltage transistor forming region and a p-type medium-voltage transistor forming region.

Subsequently, as with the method of manufacturing a semiconductor device according to the first embodiment illustrated in FIGS. 15A to 16A, the ONO film 42 in the peripheral circuit region is removed. In this embodiment, the ONO film 42 is also formed in the recess at the boundary between the isolation film 28 and the active region. Accordingly, after the silicon oxide film 42c and the silicon nitride film 42b are removed, an operation of removing a fluorocarbon film as a residual film similar to that in the first embodiment is performed, so that the degradation in withstand voltage of the high-voltage transistor is prevented.

In particular, after a photoresist film 44 exposing the peripheral circuit region and covering the memory cell region is formed, by using this photoresist film 44 as a mask, the silicon oxide film 42c and the silicon nitride film 42b are etched, for example, by dry etching performed in a magnetron reactive ion etching apparatus. Next, a fluorocarbon film which adheres to the surface of the substrate when the silicon oxide film 42c and the silicon nitride film 42b are etched is removed by the first or the second method of the first embodiment. Next, by using the photoresist film 44 as a mask, for example, wet etching is performed by an aqueous hydrofluoric acid solution diluted with pure water at a ratio of approximately 100:1 to 200:1, so that the silicon oxide film 42a is removed. By ashing and a subsequent post-treatment, the photoresist film 44 is then removed.

By removing the ONO film 42 as described above, the shape of the recess formed at the boundary between the isolation film 28 and the active region is prevented from being changed.

Subsequently, as with the method of manufacturing a semiconductor device according to the first embodiment illustrated in FIGS. 17A and 21A, three types of gate insulating films 54, 56, and 58 having different thicknesses from each other are formed in the low-voltage transistor forming region, the medium-voltage transistor forming region, and the high-voltage transistor forming region, respectively (see FIG. 21A).

A polysilicon film 60 having a thickness of, for example, 50 nm to 200 nm is then formed on the entire surface of the silicon substrate 10, for example, by a CVD method. The polysilicon film 60 is formed into the control gate 70 of the non-volatile memory and gate electrodes 86 of the peripheral transistors. The polysilicon film 60 may be formed on the entire surface of the silicon substrate 10, or the polysilicon film 60 may be formed over the entire surface of the silicon substrate 10.

Next, a silicon oxide film 114 having a thickness of, for example, 15 nm to 40 nm is formed on the polysilicon film 60, for example, by a CVD method (FIG. 38C).

A BARC film 64 and a photoresist film 66 are then formed on the silicon oxide film 114 by a spin coating method.

Figure 39A:
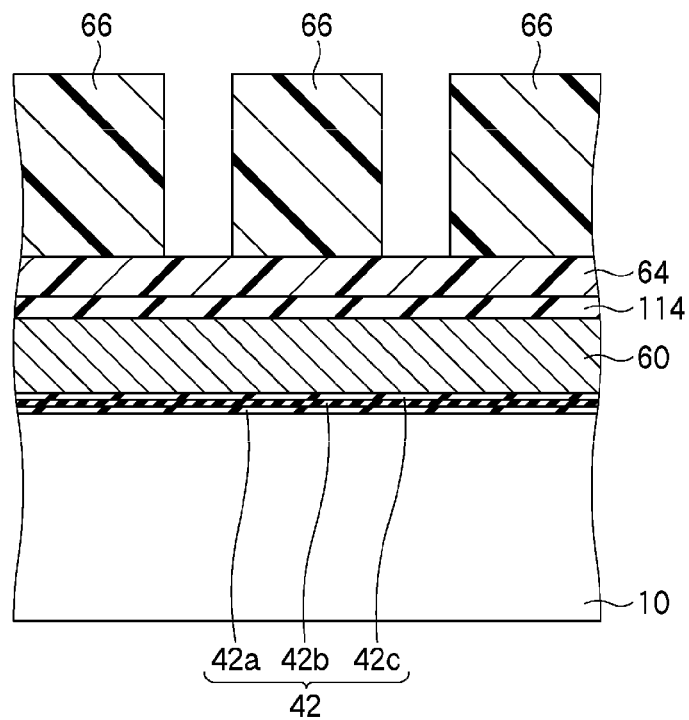
FIGS. 39A-39B are cross-sectional views each illustrating an operation of the method of manufacturing the semiconductor device according to the third embodiment (part 2)

Subsequently, the photoresist film 66 is patterned by photolithography so as to cover the entire surface of the peripheral circuit region and the control gate forming region of the memory cell region (FIG. 39A).

Next, by using the photoresist films 66 as a mask, the BARC film 64, the silicon oxide film 114, and the polysilicon film 60 are patterned, for example, by anisotropic etching performed in an inductively coupled plasma etching apparatus, so that the control gate 70 is formed from the polysilicon film 60 in the memory cell region.

Subsequently, ion implantation is performed using the photoresist film 66 and the control gate 70 as a mask, so that impurity diffusion regions 74 used as the source/drain regions 98 are formed.

Figure 39B:
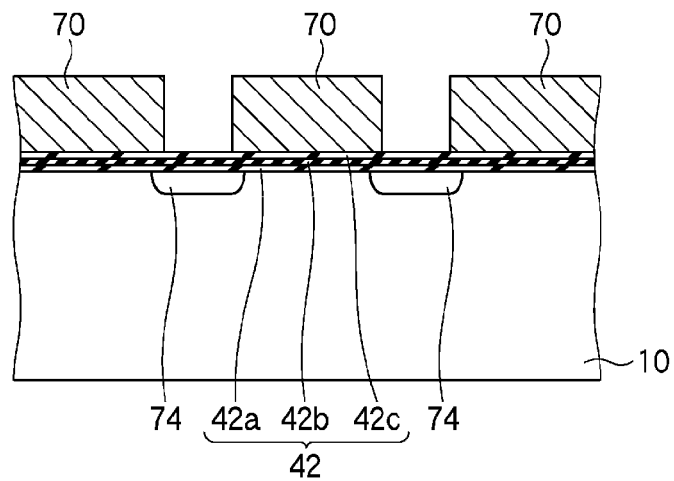

Next, by ashing and a subsequent post-treatment, the silicon oxide film 114, the BARC film 64, and the photoresist film 66 remaining on the polysilicon film 60 are removed (FIG. 39B). The peripheral circuit region is still entirely covered with the polysilicon film 60 (see FIG. 25A).

Figure 40A:
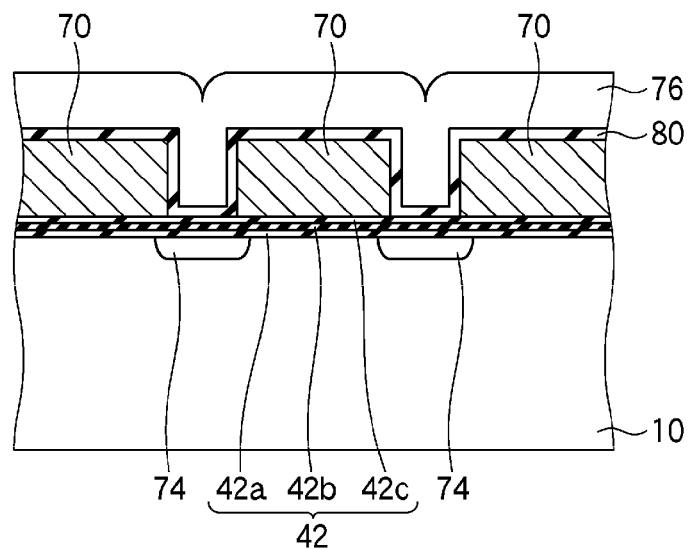
FIGS. 40A-40B are cross-sectional views each illustrating an operation of the method of manufacturing the semiconductor device according to the third embodiment (part 3).

The silicon oxide film 80 having a thickness of, for example, 1 nm to 20 nm and the silicon nitride film 76 having a thickness of, for example, 50 nm to 170 nm are then formed on the entire surface of the ONO film 42, for example, by a thermal CVD method (FIG. 40A). The silicon oxide film 80 and the silicon nitride film 76 may be formed on the ONO film 42, or the silicon oxide film 80 and the silicon nitride film 76 may be formed over the ONO film 42.

Figure 40B:
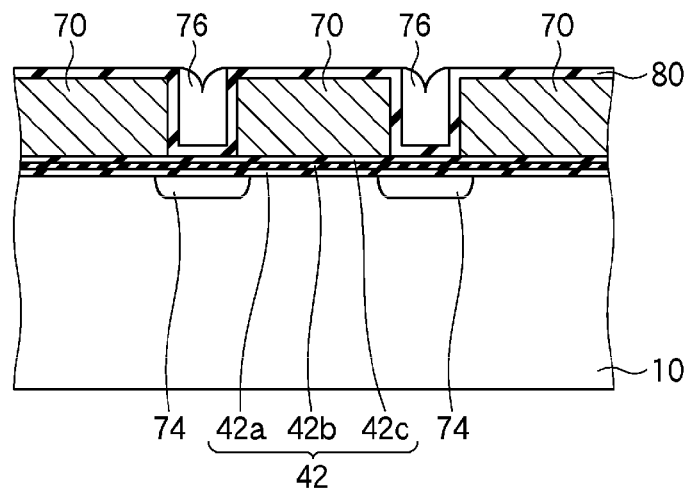

Subsequently, the silicon nitride film 76 is anisotropically etched by dry etching until the upper surface of the silicon oxide film 80 is exposed, so that the space between the control gates 70 is filled with the silicon oxide film 80 and the silicon nitride film 76 (FIG. 40B). As a result, the non-volatile memory of this embodiment is formed.

As with the method of manufacturing a semiconductor device according to the first embodiment illustrated in FIGS. 26A to 28B, after the gate electrodes 86 are formed by patterning the polysilicon film 60 in the peripheral circuit region, source/drain regions 96 are then formed, so that the low-voltage transistor, the medium-voltage transistor, and the high-voltage transistor are formed.

Next, a salicide process and predetermined backend processes, such as a multilayer wiring process, are performed, so that the semiconductor device is formed.

As described above, according to this embodiment, when the ONO film in the peripheral circuit region is removed, after the top insulating film and the intermediate layer are removed, the operation of removing a fluorocarbon film as a residual film adhering to the surface is performed; hence, during a subsequent process of removing the bottom insulating film, the shape of the recess formed at the end portion of the isolation film is prevented from being changed. Accordingly, the electric field concentration on the end portion of the isolation film is prevented, and hence the degradation in withstand voltage of the gate insulating film of the peripheral transistor may be prevented.

In addition to the above embodiments, various modifications may be made.

For example, the case in which the present embodiment is applied when the ONO film used as an inter-gate insulating film or a charge storage layer is removed has been described in the above embodiments; however, the present embodiment is not limited thereto. The present embodiment may be widely applied to a method of manufacturing a semiconductor device which has a lower layer insulating film having etching properties equivalent to those of an isolation region and an upper layer insulating film formed on the lower layer insulating film, in which a manufacturing process using a fluorocarbon-based gas for etching the upper layer insulating film is performed.

In a silicon-based semiconductor device, as the lower layer insulating film, a silicon oxide-based insulating film (silicon oxide film or silicon nitride film) may be used. In addition, as the upper layer insulating film, for example, a single silicon nitride film, a multilayer film of a silicon nitride film and a silicon oxide film, or a high dielectric constant insulating film, such as an alumina ($Al_2O_3$) film or a hafnia film ($HfO_2$), may be used.

In addition, as the fluorocarbon-based gas used for etching the upper layer insulating film, a flon gas, such as hydrofluorocarbon (HFC) or fluorocarbon (FC), may also be used as well as the gases described in the above embodiments.

In addition, the structure and the process conditions of the semiconductor device described in the above embodiments have been illustrated by way of example and may be appropriately changed and modified whenever necessary.

In the above embodiments, the case in which the present embodiment is applied to the method of manufacturing a semiconductor device including a transistor and a non-volatile memory has been described by way of example; however, the present embodiment is not only limited to a semiconductor device including a transistor and a non-volatile memory.

As described above, the present embodiment may be widely applied to a method of manufacturing a semiconductor device which has a lower layer insulating film containing etching properties equivalent to those of an isolation region and an upper layer insulating film formed on the lower layer insulating film, in which a manufacturing process using a fluorocarbon-based gas for etching the upper layer insulating film is performed. In particular, when the underlayer for the lower layer insulating film has an operation, the present embodiment may be effectively used.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A method of manufacturing a semiconductor device, comprising:
    forming an isolation region defining an active region in a semiconductor substrate;
    forming a silicon oxide film in the isolation region and polishing an upper portion of the silicon oxide film formed in the isolation region;
    forming a sacrifice oxide film over the active region;
    forming wells in the active region;
    removing the sacrifice oxide film, a recess being formed in the isolation region adjacent to the boundary between the active region and the isolation region as a result of the removal of the sacrifice oxide film;
    after removing the sacrifice oxide film, forming a first insulating film over the semiconductor substrate;
    forming a second insulating film having etching properties different from those of the first insulating film over the first insulating film;
    selectively removing the second insulating film from a first region over the active region and the isolation region by dry etching using a fluorocarbon-based etching gas to form a fluorocarbon film over the first insulating film;
    removing the fluorocarbon film by exposing to a mixed gas including an Ar gas and oxygen gas in a magnetron RIE apparatus; and
    selectively removing the first insulating film from the first region by wet etching.

2. The method according to claim 1, wherein the removing the fluorocarbon film is performed by using the oxygen gas having a flow rate of 0.5% to 25% of the total flow rate of the mixed gas.

3. The method according to claim 1, wherein the selectively removing the second insulating film and the removing the fluorocarbon film are continuously performed in the same process chamber.

4. The method according to claim 1, wherein the third insulating film is formed to have etching properties equivalent to those of the first insulating film.

5. The method according to claim 1, further comprising
    forming an MIS transistor having a gate insulating film and a gate electrode in the active region within the first region,
    wherein the gate insulating film is formed on the active region of the first region after the selectively removing the first insulating film, and the gate electrode is formed on the gate insulating film.

6. The method according to claim 5, wherein the forming the gate electrode is performed by forming the gate electrode including at least a fourth insulating film formed by thermal oxidation of the semiconductor substrate exposed by the selectively removing the first insulating film.

7. The method according to claim 1, further comprising
    forming a nonvolatile memory having the first insulating film and the second insulating film over the active region of a second region different from the first region.

8. The method according to claim 7, wherein the forming the non-volatile memory having the first insulating film and the second insulating film over the active region of the second region different from the first region includes
    forming a tunnel gate insulating film over the active region of the second region,
    forming a floating gate having the first insulating film and the second insulating film over the tunnel gate insulating film in the second region after the forming the isolation region and before the forming the first insulating film, and
    forming a control gate above the floating gate after the selectively removing the first insulating film from the first region.

9. The method according to claim 7, wherein the forming the non-volatile memory having the first insulating film and the second insulating film over the active region of the second region different from the first region includes
    selectively removing the first insulating film over the second region after the forming the first insulating film over the semiconductor substrate,
    forming the second insulating film over the active region of the second region, the second insulating film being able to accumulate a charge, and
    forming a control gate over the second insulating film.

10. The method according to claim 1, wherein the forming the isolation region is performed by embedding the insulating film in a trench formed in the semiconductor substrate.

11. The method according to claim 1, wherein the first insulating film includes silicon oxide.

12. The method according to claim 1, wherein the second insulating film includes silicon nitride.

13. The method according to claim 1, wherein the second insulating film includes silicon nitride and silicon oxide.

* * * * *